(12) United States Patent
Jung et al.

(10) Patent No.: US 12,283,301 B2
(45) Date of Patent: Apr. 22, 2025

(54) SEMICONDUCTOR MEMORY DEVICE AND OPERATING METHOD THEREOF

(71) Applicant: SK hynix Inc., Gyeonggi-do (KR)

(72) Inventors: Chul Moon Jung, Gyeonggi-do (KR); Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 454 days.

(21) Appl. No.: 17/824,634

(22) Filed: May 25, 2022

(65) Prior Publication Data
US 2023/0215484 A1   Jul. 6, 2023

(30) Foreign Application Priority Data
Jan. 3, 2022  (KR) ................. 10-2022-0000256

(51) Int. Cl.
| | | |
|---|---|---|
| G11C 11/40 | (2006.01) | |
| G11C 11/406 | (2006.01) | |
| G11C 11/408 | (2006.01) | |
| G11C 11/4094 | (2006.01) | |
| G11C 11/4096 | (2006.01) | |

(52) U.S. Cl.
CPC ........ *G11C 11/406* (2013.01); *G11C 11/4085* (2013.01); *G11C 11/4094* (2013.01); *G11C 11/4096* (2013.01)

(58) Field of Classification Search
CPC ............. G11C 11/406; G11C 11/4085; G11C 11/4094; G11C 11/4096; G11C 2029/1204; G11C 11/4091; G11C 11/40622; G11C 11/40611; G11C 11/408; G11C 11/4087; G11C 29/4401; G11C 29/76
See application file for complete search history.

(56) References Cited

U.S. PATENT DOCUMENTS

| | | | |
|---|---|---|---|
| 9,087,554 B1 | 7/2015 | Park | |
| 2020/0251158 A1 | 8/2020 | Shore et al. | |
| 2023/0021622 A1* | 1/2023 | Cho | ............ G11C 11/4078 |
| 2023/0185460 A1* | 6/2023 | Kim | ............ G06F 3/0653 |
| | | | 711/105 |

FOREIGN PATENT DOCUMENTS

KR   10-2014834 B1   8/2019

\* cited by examiner

*Primary Examiner* — Mohammed A Bashar
(74) *Attorney, Agent, or Firm* — IP & T GROUP LLP

(57) ABSTRACT

A semiconductor memory device includes: a memory cell region including a plurality of cell mats in each of which a plurality of rows are disposed, each row coupled to normal cells and row-hammer cells; a repair control circuit suitable for generating a pairing flag denoting whether a cell mat in which an active row corresponding to an active address is disposed, is repaired with another cell mat; and a refresh control circuit suitable for: selecting, when an active command is inputted, a sampling address based on first and second data read from the row-hammer cells of the active row, refreshing, when a target refresh command is inputted, one or more adjacent rows to a target row corresponding to the sampling address, and selectively refreshing, when the target refresh command is inputted, one or more adjacent rows to a paired row of the target row according to the pairing flag.

27 Claims, 15 Drawing Sheets

SEMICONDUCTOR MEMORY DEVICE AND OPERATING METHOD THEREOF

CROSS-REFERENCE TO RELATED APPLICATION

The present application claims the benefit of Korean Patent Application No. 10-2022-0000256, filed on Jan. 3, 2022, which is incorporated herein by reference in its entirety.

BACKGROUND

1. Field

Various embodiments of the present invention relate to a semiconductor design technology, and more particularly, to a semiconductor memory device that performs a target refresh operation.

2. Description of the Related Art

Recently, in addition to a normal refresh operation for sequentially refreshing a plurality of word lines, an additional refresh operation which will be hereinafter referred to as a 'target refresh operation', is being performed on memory cells of a specific word line that is likely to lose data due to row hammering. The row hammering phenomenon refers to a phenomenon in which data of memory cells coupled to a specific word line or neighboring word lines disposed adjacent to the specific word line are damaged due to a high number of activations of the specific word line. In order to prevent the row hammering phenomenon, a target refresh operation is performed on a word line that is activated more than a predetermined number of times, and neighboring word lines disposed adjacent to the word line.

SUMMARY

Embodiments of the present invention are directed to a semiconductor memory device having row-hammer cells coupled to each of a plurality of rows in a memory cell region and configured to store first and second data into the row-hammer cells in each row and configured to perform a target refresh operation on a selected row and a paired row of the selected row depending on the first and second data stored in the row-hammer cells of the selected row. The first data may represent the number of accesses to the selected row and the second data may represent the number of accesses to the paired row.

According to an embodiment of the present invention, a semiconductor memory device includes a memory cell region including a plurality of cell mats in each of which a plurality of rows are disposed, each row coupled to normal cells and row-hammer cells; a repair control circuit suitable for generating a pairing flag denoting whether a cell mat in which an active row corresponding to an active address is disposed, is repaired with another cell mat; and a refresh control circuit suitable for: selecting, when an active command is inputted, a sampling address based on first and second data read from the row-hammer cells of the active row, refreshing, when a target refresh command is inputted, one or more adjacent rows to a target row corresponding to the sampling address, and selectively refreshing, when the target refresh command is inputted, one or more adjacent rows to a paired row of the target row according to the pairing flag.

According to an embodiment of the present invention, a semiconductor memory device includes a memory cell region including a plurality of cell mats in each of which a plurality of rows are disposed, each row coupled to normal cells, first row-hammer cells and second row-hammer cells; a refresh control circuit suitable for selecting, when an active command is inputted, a sampling address based on first and second data respectively read from the first and second row-hammer cells of an active row corresponding to an active address, and outputting, when the target refresh command is inputted, a row-hammer address by calculating one or more first and second adjacent addresses from the sampling address according to a pairing control signal denoting whether a cell mat in which a target row corresponding to the sampling address is disposed is repaired with another cell mat; and a row control circuit suitable for refreshing one or more rows corresponding to the row-hammer address according to the target refresh command.

According to an embodiment of the present invention, an operating method of a semiconductor memory device including a plurality of cell mats in each of which a plurality of rows are disposed, each row coupled to normal cells and row-hammer cells, includes selecting, when an active command is inputted, a sampling address based on first and second data read from the row-hammer cells of an active row corresponding to an active address; outputting, when the target refresh command is inputted, a row-hammer address by calculating one or more first and second adjacent addresses from the sampling address according to a pairing control signal denoting whether a cell mat in which a target row corresponding to the sampling address is disposed is repaired with another cell mat; and refreshing one or more rows corresponding to the row-hammer address according to the target refresh command.

According to an embodiment of the present invention, an operating method of a semiconductor memory device includes determining an active row of memory cells as a target row when a sum of first and second data is greater than a threshold; and performing target refresh operations on first and second row-hammer rows respectively adjacent to the target row and a paired row of the target row, wherein the first and second data represent numbers of accesses to the respective target and paired rows and are stored in the target row, wherein the target and paired rows are included in respective first and second cell mats, a column of memory cells within the first cell mat being repaired through a column within the second cell mat.

Further, according to embodiments of the present invention, in the semiconductor memory device with a column repair scheme (hereinafter, referred to as a "2WL column repair scheme") in which rows of different cell mats are activated simultaneously, the row-hammer address may be selected according to the actual number of accesses calculated by adding the number of direct accesses of each row and the number of indirect accesses by a paired row of each row, thereby optimizing the defense capability for row-hammer, and improving the accuracy of the refresh operation. Thus, the power consumption required for the refresh operation can be minimized, and the efficiency of the refresh operation can be improved.

DETAILED DESCRIPTION

Figure 1A:
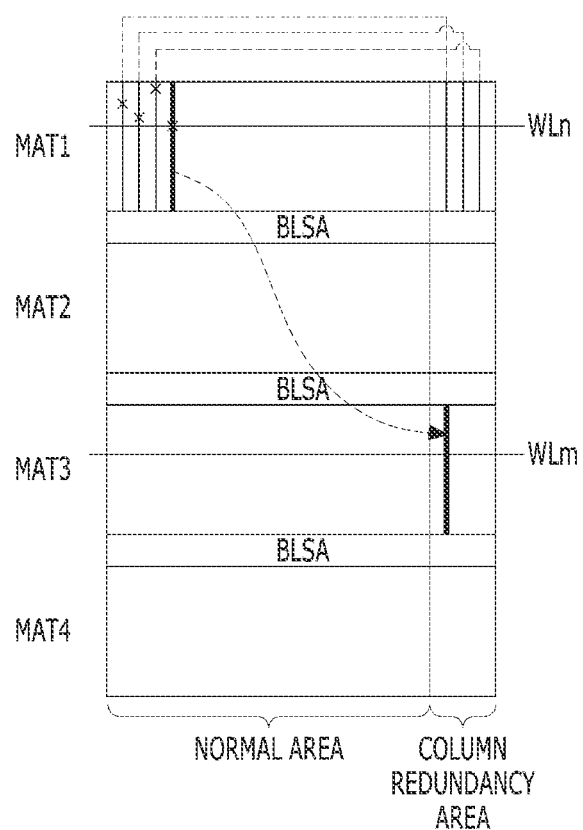
FIGS. 1A and 1B are diagrams illustrating a 2WL column repair scheme.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Semiconductor memory devices, such as double data rate synchronous DRAM (DDR SDRAM), are equipped with countless memory cells, and the number of memory cells is also increasing as the integration of semiconductor memory devices increases rapidly. These memory cells form a regularly arranged memory cell array, which is referred to as a memory cell mat or a memory block. Recently, in order to expand the memory repair function and utilize resources, a 2WL column repair method has been proposed as a repair scheme using different cell mats. In the 2WL column repair method, since a bit line of a specific cell mat is repaired by a bit line (hereinafter, column) of another cell mat, a word line (hereinafter, row) of a specific cell mat may be simultaneously activated during an active operation.

Figure 1B:
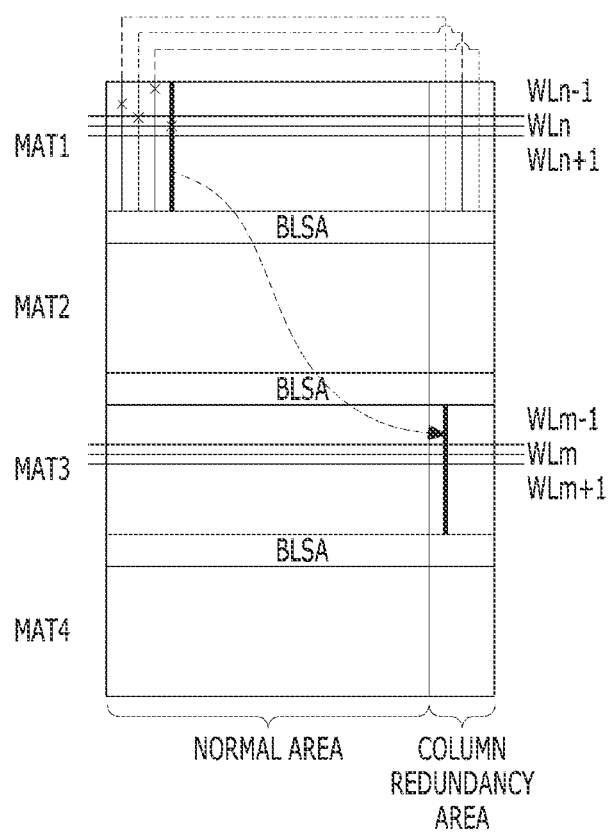

FIGS. 1A and 1B are diagrams illustrating a 2WL column repair scheme.

Referring to FIG. 1A, a case where first to fourth cell mats MAT1 to MAT4 are disposed in a memory cell area, and 3 redundancy columns to replace defective columns of a normal area are provided in a column redundancy area in each cell mat, is shown. A bit line sense amplifier BLSA may be shared between adjacent cell mats among the first to fourth cell mats MAT1 to MAT4.

When 3 defective columns are detected in the first cell mat MAT1 and all 3 defective columns are repaired into 3 redundancy columns of the same cell mat, additionally detected defective columns may be repaired by redundancy columns of the third cell mat MAT3 that do not share the bit line sense amplifier BLSA. To this end, when a row WLn of the first cell mat MAT1 is activated, a row WLm of the third cell mat MAT3 may be simultaneously activated, and two rows WLn and WLm of different mats MAT1 and MAT3 to be activated simultaneously may be defined as paired rows.

Referring to FIG. 1B, when the nth row WLn of the first cell mat MAT1 is repeatedly active-precharged, adjacent rows WLn−1, WLn+1 are vulnerable to row-hammering, and thus it is necessary to perform a target refresh operation on adjacent rows WLn−1, WLn+1.

In this case, when the 2WL column repair scheme is applied, not only adjacent rows WLn−1 and WLn+1 of the nth row of the first cell mat MAT1 but also adjacent rows WLm−1 and WLm+1 of the third cell mat MAT3, which is a paired row of the first cell mat MAT1, may be vulnerable to the row-hammering. As a result, a target refresh operation is required to be performed on the adjacent rows WLn−1 and WLn+1 and the adjacent rows WLm−1 and WLm+1. However, the row WLm of the third cell mat MAT3 is simultaneously activated when the row WLn of the first cell mat MAT1 is activated, whereas the first cell mat MAT1 is not activated when the row WLm of the third cell mat MAT3 is activated since the row WLm of the third cell mat MAT3 is not repaired. Accordingly, it is difficult to determine whether the target refresh operation is performed on the adjacent rows WLm−1 and WLm+1 of the mth row WLm of the third cell mat MAT3.

Hereinafter, in an embodiment of the present invention, a method for performing a target refresh operation in case where a 2WL column repair scheme is applied will be described.

Figure 2:
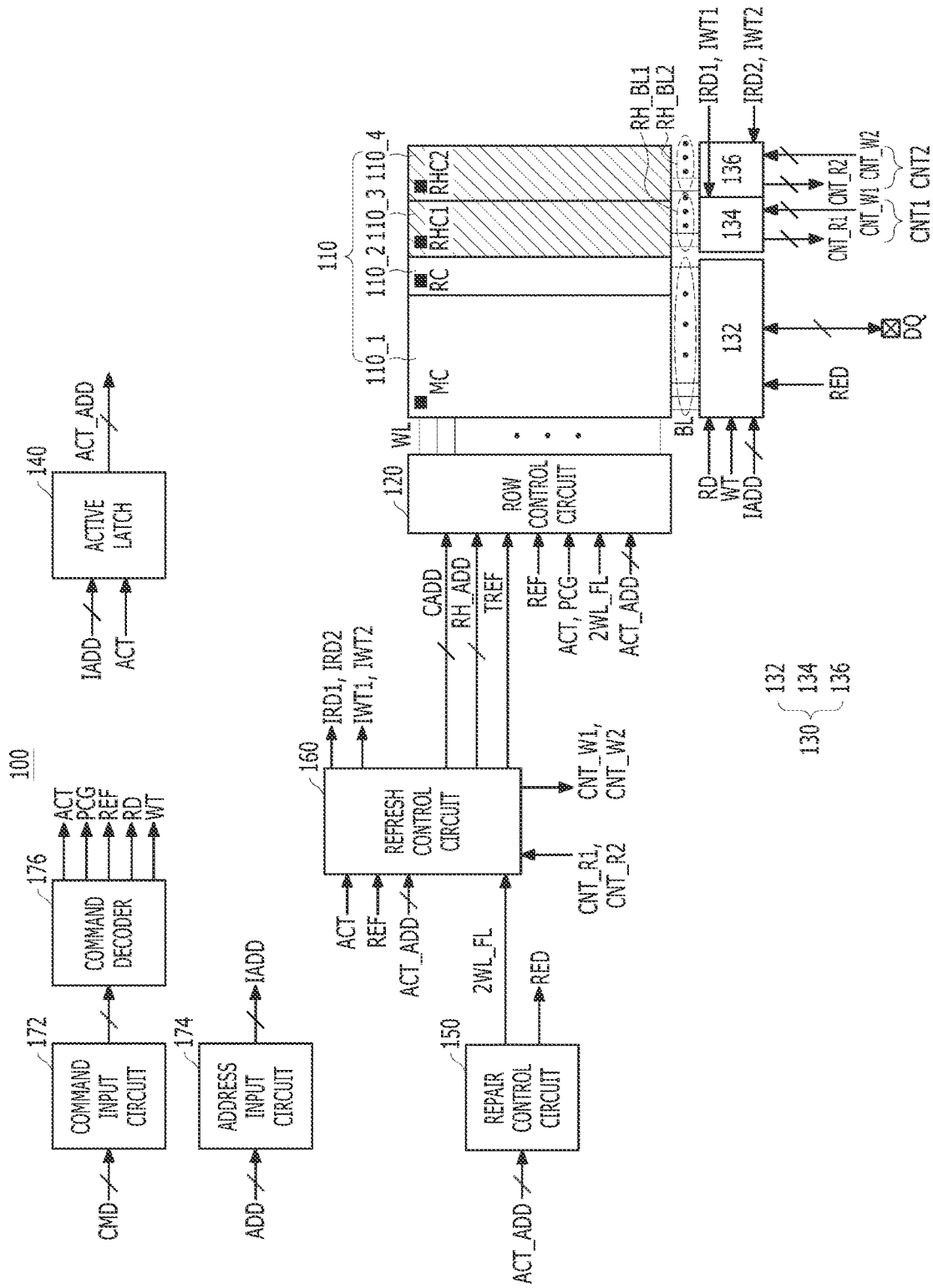
FIG. 2 is a block diagram illustrating a semiconductor memory device in accordance with an embodiment of the present invention.

FIG. 2 is a block diagram illustrating a semiconductor memory device 100 in accordance with an embodiment of the present invention.

Referring to FIG. 2, the memory device 100 may include a memory cell region 110, a row control circuit 120, a column control circuit 130, an active latch 140, a repair control circuit 150, a refresh control circuit 160, a command input circuit 172, an address input circuit 174, and a command decoder 176.

The memory cell region 110 may include a plurality of cell mats. In each of the cell mats, a plurality of memory cells MC, RC, RHC1 and RHC2, which are arranged in an array type and coupled to a plurality of word lines WL (hereinafter, referred to as rows) and a plurality of bit lines BL, RH_BL1, and RH_BL2 (hereinafter, referred to as columns). The rows WL may be extended into a first direction (e.g., a row direction), and sequentially arranged in a second direction (e.g., a column direction).

In accordance with an embodiment, the memory cell region 110 may be divided into a normal cell region 110_1, a redundancy cell region 110_2, a first row-hammer (RH) cell region 110_3, and a second RH cell region 110_4. A plurality of normal cells MC may be arranged in an array type in the normal cell region 110_1, a plurality of redundancy cells RC may be arranged in an array type in the redundancy cell region 110_2, a plurality of first row-hammer cells RHC1 may be arranged in an array type in the first RH cell region 1103, and a plurality of second row-hammer cells RHC2 may be arranged in an array type in the second RH cell region 110_4. The plurality of normal cells MC, the plurality of redundancy cells RC, the plurality of first row-hammer cells RHC1, and the plurality of second row-hammer cells RHC2 may be coupled to each of the rows WL. The plurality of normal cells MC may store normal data including user data, the plurality of redundancy cells RC may be cells for replacing defective cells among the normal cells MC. The plurality of first row-hammer cells RHC1 may store first data CNT1 representing the number of direct accesses to a corresponding row, and the plurality of second row-hammer cells RHC2 may store second data CNT2 representing the number of indirect accesses to the corresponding row. At this time, the number of direct accesses to a row may mean the number of accesses to the row, and the number of indirect accesses to the row may mean the number of accesses to a paired row of the row.

For reference, in FIG. 2, the first data CNT1 read from the first row-hammer cells RHC1 are denoted by a reference numeral "CNT_R1", and the first data CNT1 to be written to the first row-hammer cells RHC1 are denoted by a reference numeral "CNT_W1". In addition, the second data CNT2 read from the second row-hammer cells RHC2 are denoted by a reference numeral "CNT_R2", and the second data CNT2 to be written to the second row-hammer cells RHC2 are denoted by a reference numeral "CNT_W2". A detailed configuration and operation of the memory cell region 110 will be described in FIGS. 3 and 4.

The command input circuit 172 may receive a command CMD, and the address input circuit 174 may receive an address ADD, from an external device (e.g., a memory controller). The address input circuit 174 may receive the address ADD and output an internal input address IADD. Each of the command CMD and the address ADD may include a multi-bit signal. The command decoder 176 may decode the command CMD input through the command input circuit 172 and may generate an active command ACT, a precharge command PCG, a normal refresh command REF, a read command RD, and a write command WT. The command decoder 176 may generate a mode register set (MRS) command and other commands, by decoding received commands CMD.

The active latch 140 may latch the internal input address IADD as an active address ACT_ADD according to the active command ACT.

The repair control circuit 150 may store cell mat information (i.e., 2WL column repair information) repaired to another cell mat. When the active address ACT_ADD is input, the repair control circuit 150 may check whether a cell mat in which a row (hereinafter, referred to as an active row) corresponding to the active address ACT_ADD is disposed matches the stored cell mat information, and activate a pairing flag 2WL_FL when the cell mat matches the stored cell mat information. That is, the pairing flag 2WL_FL may denote whether a cell mat in which the active row corresponding to the active address ACT_ADD is disposed is repaired to another cell mat. In addition, the repair control circuit 150 may store a repair address of the memory cell region 110 to output repair information RED corresponding to the active address ACT_ADD. Hereinafter, a case in which the repair information RED is column repair information will be described as an example.

When the active command ACT is inputted, the refresh control circuit 160 may select a sampling address (SAM_ADD of FIG. 5) based on first data CNT_R1 and second data CNT_R2 read out from the active row. For example, the refresh control circuit 160 may select and store the active address ACT_ADD as the sampling address SAM_ADD when a sum of the first data CNT_R1 and the second data CNT_R2 is greater than or equal to a specific value. Here, the specific value may be set by a pre-stored maximum value. When the active command ACT is inputted, the refresh control circuit 160 may update the first data CNT_R1 read out from the active row by increasing a value of the first data CNT_R1 by "+1", and control the updated first data CNT_W1 to be written into the active row. When the active command ACT is inputted, the refresh control circuit 160 may update second data CNT_R2 read out from a paired row of the active row by increasing a value of the second data CNT_R2 by "+1", and control the updated second data CNT_W2 to be written into the paired row.

The refresh control circuit 160 may generate a counting address CADD that is increasing "+1" whenever the normal refresh command REF is inputted. The refresh control circuit 160 may issue a target refresh command TREF whenever the number of inputs of the normal refresh command REF reaches a preset number. When the target refresh command TREF is issued, the refresh control circuit 160 may output a row-hammer address RH_ADD by determining whether to perform a target refresh operation on one or more adjacent rows adjacent to a row (hereinafter, referred to as a target row) corresponding to the sampling address SAM_ADD, and by determining whether to perform a target refresh operation on one or more adjacent rows adjacent to a paired row of the target row according to the pairing flag 2WL_FL. That is, the refresh control circuit 160 may control the target refresh operation on the adjacent row of the target row to be performed, and control the target refresh operation on the adjacent row of the paired row of the target row to be selectively performed based on the pairing flag 2WL_FL. After the target refresh operation, the refresh control circuit 160 may control first row-hammer cells RHC1 and second row-hammer cells RHC2 of the target row to be initialized by writing certain values (e.g., all-zero values) into the first row-hammer cells RHC1 and the second row-hammer cells RHC2 of the target row. Further, the refresh control circuit 160 may control first row-hammer cells RHC1 and second row-hammer cells RHC2 of the paired row of the target row to be initialized by writing certain values (e.g., all-zero values) into the first row-hammer cells RHC1 and the second row-hammer cells RHC2 of the paired row.

Meanwhile, the refresh control circuit 160 may issue first and second internal read signals IRD1 and IRD2, and first and second internal write signals IWT1 and IWT2, according to the active command ACT and the pairing flag 2WL_FL. For example, the refresh control circuit 160 may sequentially issue the first and second internal read signals IRD1 and IRD2, and the first internal write signal IWT1 when the active command ACT is inputted. Thereafter, the refresh control circuit 160 may issue the second internal read signal IRD2 and the second internal write signal IWT2 according to the pairing flag 2WL_FL. The refresh control circuit 160 may additionally issue the first and second internal write signals IWT1 and IWT2 in order to initialize the first row-hammer cells RHC1 and the second row-hammer cells RHC2 of the target row and the paired row. A detailed configuration and operation of the refresh control circuit 160 will be described in FIGS. 5 to 6.

The row control circuit 120 may be coupled to the normal cells MC of the normal cell region 110_1, the redundancy cells RC of the redundancy cell region 110_2, the first row-hammer cells RHC1 of the first RH cell region 110_3, and the second row-hammer cells RHC2 of the first RH cell region 110_4, through the rows WL. The row control circuit 120 may activate a row (i.e., the active row) corresponding to the active address ACT_ADD in response to the active command ACT, and may precharge the active row in response to the precharge command PCG. At this time, the row control circuit 120 may simultaneously activate the paired row of the active row according to the pairing flag 2WL_FL. That is, when the pairing flag 2WL_FL is enabled, the row control circuit 120 may activate the active row and the paired row thereof. The paired row may be designated by a paired address generated by inverting a most significant bit (MSB) of the active address ACT_ADD. The row control circuit 120 may perform a normal refresh operation of sequentially refreshing a plurality of rows WL corresponding to the counting address CADD according to the normal refresh command REF. The row control circuit 120 may perform a target refresh operation of refreshing one or more adjacent rows corresponding to the row-hammer address RH_ADD according to the target refresh command TREF.

The column control circuit 130 may include a first column control circuit 132 corresponding to the normal cell region 110_1 and the redundancy cell region 110_2, a second column control circuit 134 corresponding to the first RH cell region 110_3, and a third column control circuit 136 corresponding to the first RH cell region 110_4.

The first column control circuit 132 may be coupled to the normal cells MC of the normal cell region 110_1 and the redundancy cells RC of the redundancy cell region 110_2, through the columns BL. The first column control circuit 132 may select some columns among the columns BL, according to the repair information RED and a column address among the internal input address IADD, read out the normal data from the normal cells MC and the redundancy cells RC through the selected columns in response to the read command RD, and write the normal data provided from the outside into the normal cells MC and the redundancy cells RC through the selected columns in response to the write command WT. The first column control circuit 132 may be coupled to a data pad DQ to transmit and receive the normal data to and from an external device.

The second column control circuit 134 may be coupled to the first row-hammer cells RHC1 of the first row-hammer cell region 110_3, through the columns RH_BL1, and the third column control circuit 136 may be coupled to the second row-hammer cells RHC2 of the second row-hammer cell region 110_4, through the columns RH_BL2. The second column control circuit 134 may read out the first data CNT_R1 from the first row-hammer cells RHC1 of the first row-hammer cell region 110_3, according to the first internal read signal IRD1, and write the first data CNT_W1 into the first row-hammer cells RHC1 of the first row-hammer cell region 110_3, according to the first internal write signal IWT1. The third column control circuit 136 may read out the second data CNT_R2 from the second row-hammer cells RHC2 of the second row-hammer cell region 110_4, according to the second internal read signal IRD2, and write the second data CNT_W2 into the second row-hammer cells RHC2 of the second row-hammer cell region 110_4, according to the second internal write signal IWT2. A detailed configuration and operation of the column control circuit 130 will be described in FIG. 4.

Hereinafter, referring to FIGS. 3 to 6, a detailed configuration of the memory device 100 will be described.

Figure 3:
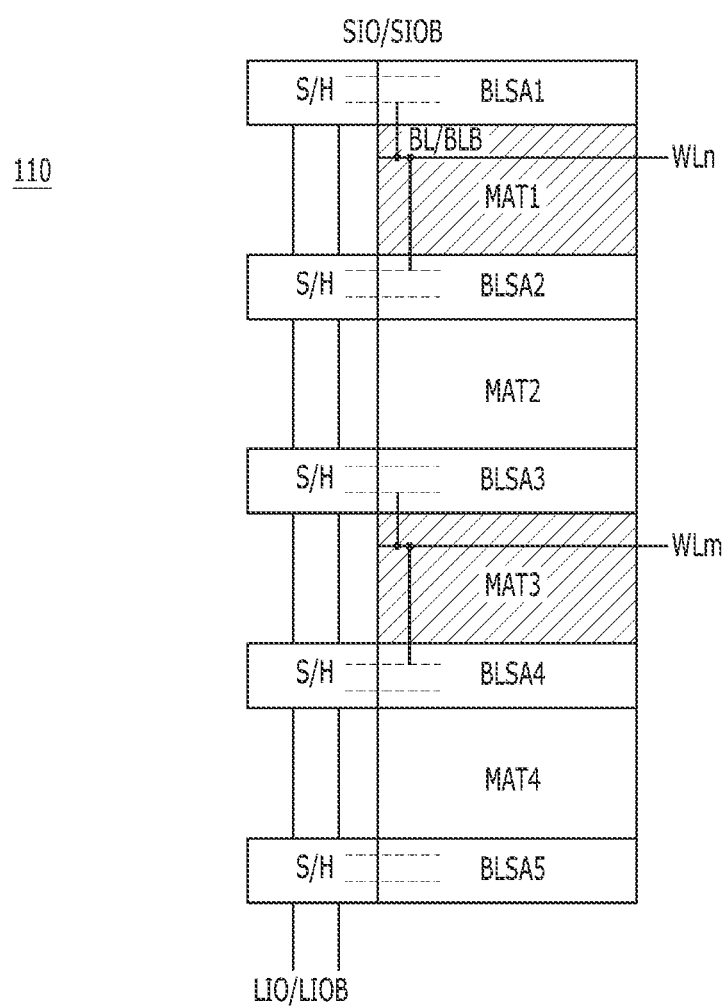
FIG. 3 is a schematic diagram illustrating an arrangement of a memory cell region of FIG. 2 in accordance with an embodiment of the present invention.

FIG. 3 is a schematic diagram illustrating an arrangement of the memory cell region 110 of FIG. 2 in accordance with an embodiment of the present invention.

Referring to FIG. 3, first to fifth bit line sense amplifiers BLSA1 to BLSA5 and first to fourth cell mats MAT1 to MAT4 may be alternatively disposed to each other in the memory cell region 110. A sub-hole region S/H may be disposed in a horizontal direction of each bit line sense amplifier to provide a driving voltage to the bit line sense amplifiers BLSA1 to BLSA5. Meanwhile, a plurality of sub word line drivers (not shown) may be disposed in a horizontal direction of each cell mat to drive the rows.

Each of the bit line sense amplifiers BLSA1 to BLSA5 is disposed between two adjacent cell mats so that adjacent cell mats may share one bit line sense amplifier. For example, the second bit line sense amplifier BLSA2 may be shared by the first cell mat MAT1 and the second cell mat MAT2, and the third bit line sense amplifier BLSA3 may be shared by the second cell mat MAT2 and the third cell mat MAT3. Although not illustrated in the drawing, the first bit line sense amplifier BLSA1 may be connected to columns of a dummy mat (not illustrated) positioned at an uppermost part of the memory cell region 110 in addition to columns of the first mat MAT1. Also, the fifth bit line sense amplifier BLSA5 may be connected to columns of a dummy mat (not illustrated) positioned at a lowermost part of the memory cell region 110 in addition to columns of the fourth mat MAT4.

For reference, FIG. 3 illustrates a memory device having an open bit line structure in which a column (hereinafter, a driving bit line) in which a data is driven and a reference bit line are disposed in different cell mats based on a bit line sense amplifier. However, the proposed invention is not limited thereto, and may be extended to a memory device having a folded bit line structure in which a driving bit line and a reference bit line are disposed in the same cell mat based on a bit line sense amplifier.

During a read operation, when a specific row is activated, the first to fifth bit line sense amplifiers BLSA1 to BLSA5 may sense and amplify data read through a column pair BL and BLB from memory cells connected to the activated row, and output the sensed data to a plurality of segment input/output (I/O) line pairs SIO and SIOB. Data transferred through the segment I/O line pairs SIO and SIOB may be transferred to the column control circuit 130 (see FIG. 2) through a plurality of local I/O line pairs LIO and LIOB through a switching operation in units of mats.

In the 2WL column repair scheme, the rows of two cell mats that do not share a bit line sense amplifier may be designated as paired rows and activated simultaneously during an active operation. For example, the nth row WLn of the first cell mat MAT1 and the mth row WLm of the third cell mat MAT3 may be designated as the paired rows and simultaneously activated. In this case, when the nth row WLn is designated by the active address ACT_ADD, the mth row WLm may be designated by the paired address generated by inverting the MSB of the active address ACT_ADD.

Accordingly, during the read operation, the first and second bit line sense amplifiers BLSA1 and BLSA2 sense and amplify data read through the column pair BL and BLB from memory cells connected to the activated nth row WLn to output the sensed data to the segment I/O line pairs SIO and SIOB. The third and fourth bit line sense amplifiers BLSA3 and BLSA4 sense and amplify data read through the column pair BL and BLB from memory cells connected to the activated mth row WLm to output the sensed data to the segment I/O line pairs SIO and SIOB. Data transferred through the segment I/O line pairs SIO and SIOB may be transferred to the column control circuit 130 through the local I/O line pairs LIO and LIOB through a switching operation in units of mats.

Figure 4:
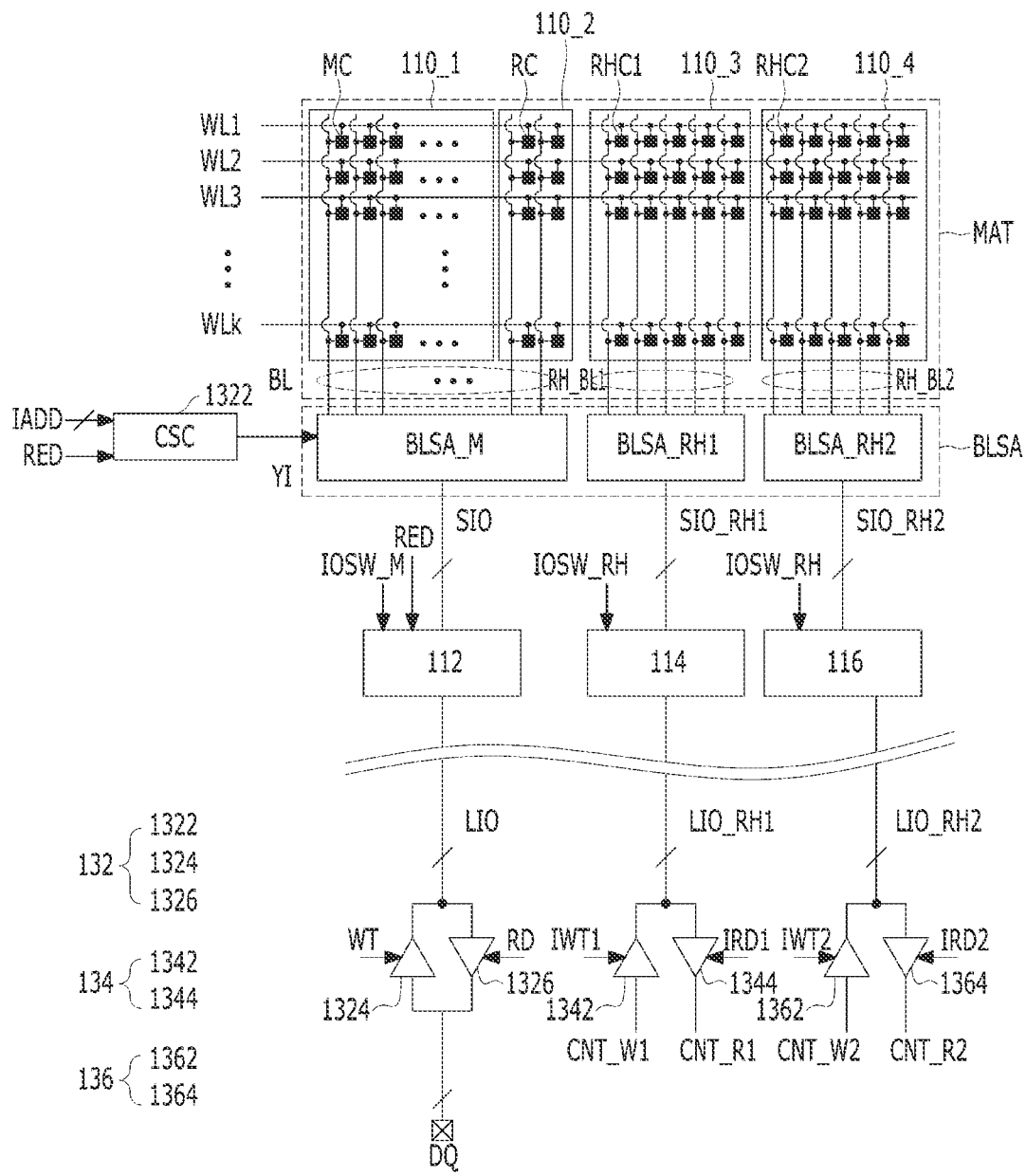
FIG. 4 is a schematic diagram illustrating a relationship between the memory cell region and a column control circuit of FIG. 2 in accordance with an embodiment of the present invention.

FIG. 4 is a schematic diagram illustrating a relationship between the memory cell region 110 and the column control circuit 130 of FIG. 2 in accordance with an embodiment of the present invention. In FIG. 4, to facilitate understanding of the embodiment of the present invention, only one cell mat (MAT) and one bit line sense amplifier (BLSA) corresponding thereto are illustrated.

Referring to FIG. 4, the plurality of normal cells MC may be arranged in an array type in the normal cell region 110_1 of the memory cell region 110, the plurality of redundancy cells RC may be arranged in an array type in the redundancy cell region 110_2, the plurality of first row-hammer cells RHC1 may be arranged in an array type in the first RH cell region 110_3, and the plurality of second row-hammer cells RHC2 may be arranged in an array type in the second RH cell region 110_4. The plurality of normal cells MC, the plurality of redundancy cells RC, the plurality of first row-hammer cells RHC1, and the plurality of second row-hammer cells RHC2 may be coupled to each of the rows WL. Though FIG. 4 illustrates a case where the normal cells MC and the first and second row-hammer cells RHC1 and RHC2 are coupled to the same row to share the row, the present invention is not limited thereto. According to an embodiment, the normal cell region 110_1, the redundancy cell region 110_2, and the first and second row-hammer cell regions 110_3 and 110_4 may be coupled to rows separated from each other to operate.

The normal cells MC and the redundancy cells RC may be coupled between the rows WL1 to WLk and the column BL to store the normal data including the user data. The normal cells MC and the redundancy cells RC may be coupled to a first bit line sense amplifying circuit BLSA_M through the column BL. The first bit line sense amplifying circuit BLSA_M may select some columns among the columns BL according to a column selection signal YI, and sense and amplify data of the selected columns to output the sensed data to segment I/O lines SIO.

The first row-hammer cells RHC1 may be coupled between the rows WL1 to WLk and the column RH_BL1 to store the first data CNT1. The first row-hammer cells RHC1 may be coupled to a second bit line sense amplifying circuit BLSA_RH1 through the column RH_BL1. The second bit line sense amplifying circuit BLSA_RH1 may sense and amplify data (i.e., the first data CNT1) of the column RH_BL1 to output the sensed data to segment I/O lines SIO_RH1.

The second row-hammer cells RHC2 may be coupled between the rows WL1 to WLk and the column RH_BL2 to store the second data CNT2. The second row-hammer cells RHC2 may be coupled to a third bit line sense amplifying circuit BLSA_RH2 through the column RH_BL2. The third bit line sense amplifying circuit BLSA_RH2 may sense and amplify data (i.e., the second data CNT2) of the column RH_BL2 to output the sensed data to segment I/O lines SIO_RH2.

In the memory cell region 110, first to third switching circuits 112, 114, and 116 may be further disposed to respectively transfer data of the segment I/O lines SIO, SIO_RH1, and SIO_RH2 to local I/O lines LIO, LIO_RH1, and LIO_RH2, through a switching operation in units of mats. The local I/O lines LIO, LIO_RH1, and LIO_RH2 may be shared by the cell mats.

The first switching circuit 112 may couple the segment I/O lines SIO to the local I/O lines LIO in response to a first I/O switching signal IOSW_M. The first switching circuit 112 may perform a repair operation in which a redundancy column of another cell mat replaces a defective column of the cell mat according to the repair information RED. The second switching circuit 114 may couple the segment I/O lines SIO_RH1 to the local I/O lines LIO_RH1 according to a second I/O switching signal IOSW_RH. The third switching circuit 116 may couple the segment I/O lines SIO_RH2 to the local I/O lines LIO_RH2 according to the second I/O switching signal IOSW_RH.

The first I/O switching signal IOSW_M and the second I/O switching signal IOSW_RH may be provided in units of mats. When the read command RD or the write command WT is inputted, the first I/O switching signal IOSW_M provided to a cell mat in which an active row is disposed and the first I/O switching signal IOSW_M provided to a cell mat in which a pair row is disposed, may be enabled, based on the active address ACT_ADD. The first I/O switching signal IOSW_M may correspond to a known I/O switching signal. According to an embodiment of the present invention, the second I/O switching signal IOSW_RH may be provided from the row control circuit 120 of FIG. 2. When the active command ACT is inputted, the row control circuit 120 may enable the second I/O switching signal IOSW_RH provided to the cell mat in which the active row is disposed based on the active address ACT_ADD, and then selectively enable the second I/O switching signal IOSW_RH provided to the cell mat in which the pair row is disposed, according to the pairing flag 2WL_FL. Furthermore, when the target refresh command TREF is inputted, the row control circuit 120 may enable the second I/O switching signal IOSW_RH provided to a cell mat in which a row corresponding to the row-hammer address RH_ADD is disposed.

The first column control circuit 132 may include a column selection circuit (CSC) 1322, a first input driving circuit 1324, and a first output driving circuit 1326. The column selection circuit 1322 may generate the column selection signal YI for select some columns among the columns BL by decoding the column address among the internal input address IADD according to the repair information RED. The column selection circuit 1322 may generate the column selection signal YI to select some columns among the columns BL by decoding the column address, and to replace a defective column when it is determined that there is the defective column among some columns based on the repair information RED. That is, the column selection circuit 1322 may perform a repair operation in which a redundancy column of the cell mat replaces a defective column of the same cell mat according to the repair information RED. The first input driving circuit 1324 may provide the normal data provided from the data pad DQ to the selected columns in response to the write command WT. Thus, the first column control circuit 132 may write the normal data into the normal cells MC during a write operation. The first input driving circuit 1324 may include a write driver. The first output driving circuit 1326 may output the normal data from the selected columns to the data pad DQ in response to the read command RD. Thus, the first column control circuit 132 may read out the normal data from the normal cells MC during a read operation. The first output driving circuit 1326 may include an I/O sense amplifier.

The second column control circuit 134 may include a second input driving circuit 1342, and a second output driving circuit 1344. The second input driving circuit 1342 may write the first data CNT_W1 provided from the refresh control circuit 160, into the first row-hammer cells RHC1 in response to the first internal write signal IWT1. The second input driving circuit 1342 may include a write driver. The second output driving circuit 1344 may output the first data CNT_R1 from the first row-hammer cells RHC1 to the refresh control circuit 160 in response to the first internal read signal IRD1. The second output driving circuit 1344 may include an input/output sense amplifier.

The third column control circuit 136 may include a third input driving circuit 1362, and a third output driving circuit 1364. The third input driving circuit 1362 may write the second data CNT_W2 provided from the refresh control circuit 160, into the second row-hammer cells RHC2 in response to the second internal write signal IWT2. The third input driving circuit 1362 may include a write driver. The third output driving circuit 1364 may output the second data CNT_R2 from the second row-hammer cells RHC2 to the refresh control circuit 160 in response to the second internal read signal IRD2. The third output driving circuit 1364 may include an input/output sense amplifier.

Figure 5:
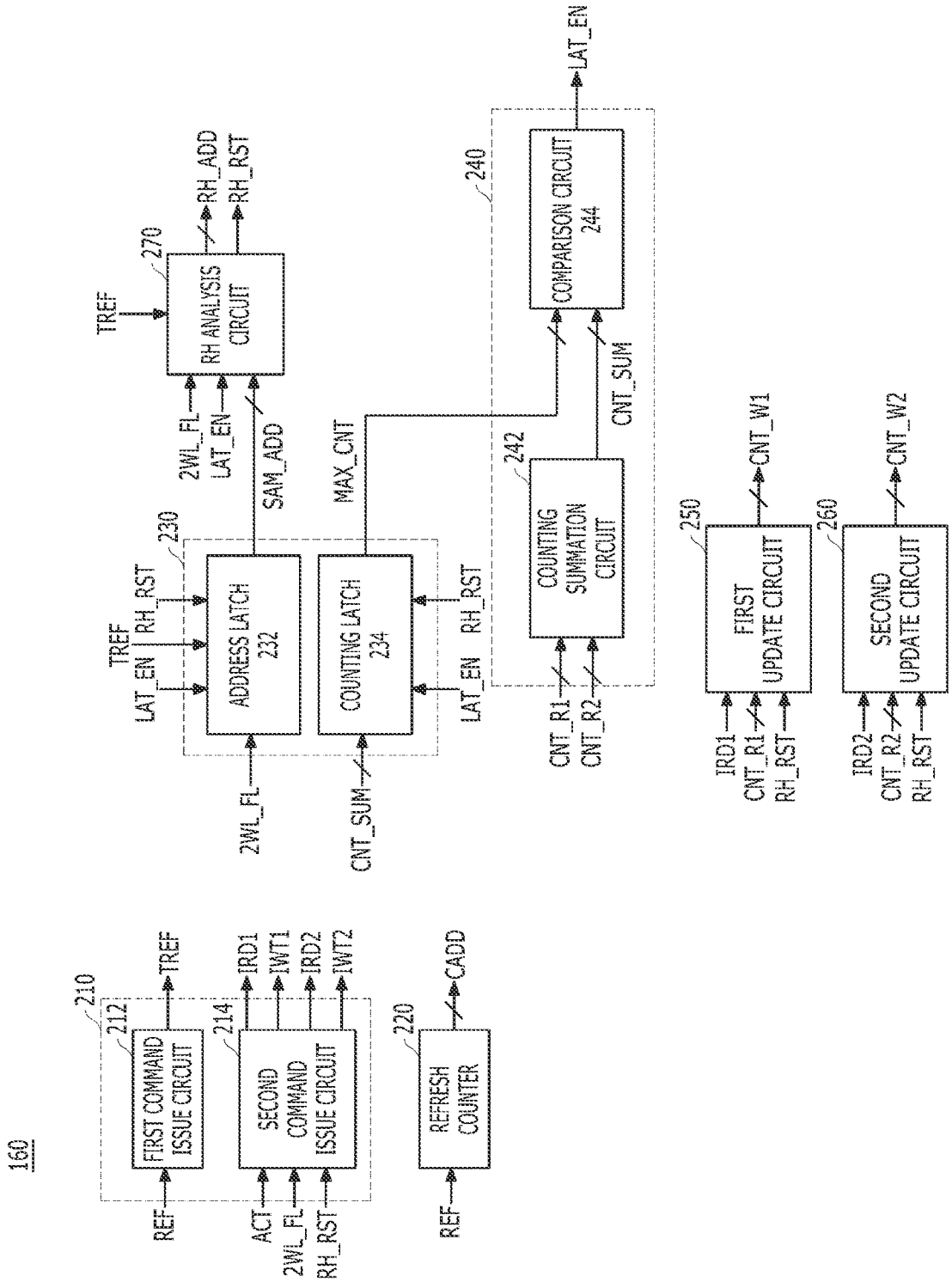
FIG. 5 is a detailed block diagram illustrating a refresh control circuit shown in FIG. 2 in accordance with an embodiment of the present invention.
Figure 6:
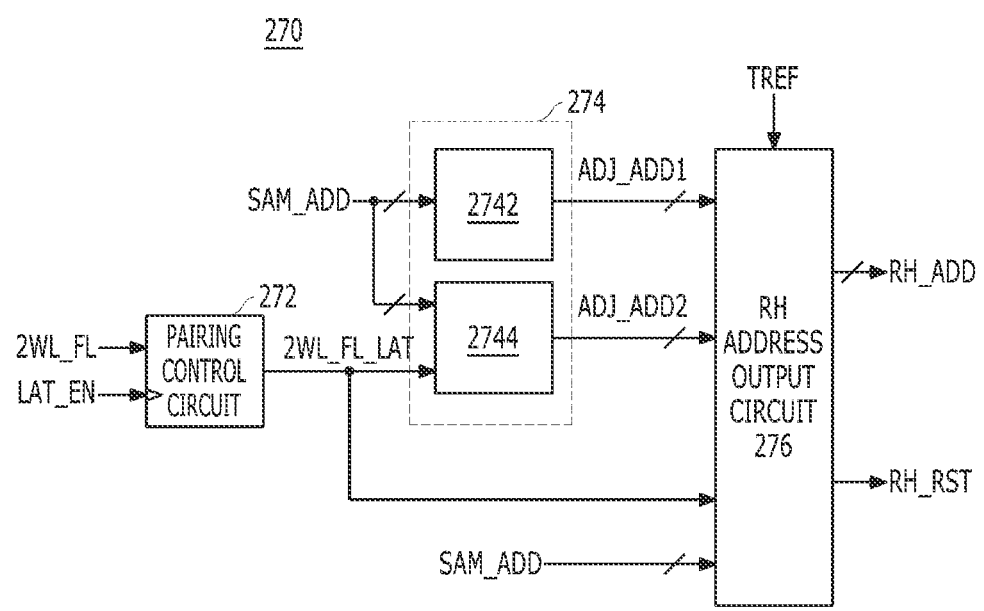
FIG. 6 is a detailed block diagram illustrating a row-hammer analysis circuit shown in FIG. 5 in accordance with an embodiment of the present invention.

FIG. 5 is a detailed block diagram illustrating the refresh control circuit 160 shown in FIG. 2. FIG. 6 is a detailed block diagram illustrating a row-hammer (RH) analysis circuit 270 shown in FIG. 5.

Referring to FIG. 5, the refresh control circuit 160 may include a command generation circuit 210, a refresh counter 220, a latch circuit 230, a latch control circuit 240, a first update circuit 250, a second update circuit 260, and a row-hammer analysis circuit 270.

The command generation circuit 210 may generate the target refresh command TREF according to the normal refresh command REF, and generate the first and second internal read signals IRD1 and IRD2, and the first and second internal write signals IWT1 and IWT2 according to the active command ACT, the pairing flag 2WL_FL and a row-hammer reset signal RH_RST.

In detail, the command generation circuit 210 may include a first command issue circuit 212 and a second command issue circuit 214. The first command issue circuit 212 may count the number of inputs of the normal refresh command REF, and issue the target refresh command TREF when the counting number reaches the preset number. The second command issue circuit 214 may issue the first and second internal read signals IRD1 and IRD2, and the first and second internal write signals IWT1 and IWT2, according to the active command ACT, the pairing flag 2WL_FL and the row-hammer reset signal RH_RST. When the active command ACT is inputted, the second command issue circuit 214 may sequentially issue the first and second internal read signals IRD1 and IRD2, and the first internal write signal IWT1. Thereafter, the second command issue circuit 214 may sequentially issue the second internal read signal IRD2 and the second internal write signal IWT2 according to the pairing flag 2WL_FL. The second command issue circuit 214 may issue the first and second internal write signals IWT1 and IWT2 once or more when the row-hammer reset signal RH_RST is enabled.

The refresh counter 220 may generate the counting address CADD that is sequentially increasing whenever the normal refresh command REF is inputted.

The latch circuit 230 may store the active address ACT_ADD and summation data CNT_SUM as the sampling address SAM_ADD and maximum counting data MAX_CNT, respectively, according to a latch enable signal LAT_EN. The latch circuit 230 may output the sampling address SAM_ADD to the row-hammer analysis circuit 270, in response to the target refresh command TREF. The latch circuit 230 may Initialize the stored address and data according to the row-hammer reset signal RH_RST.

In detail, the latch circuit 230 may include an address latch 232 and a counting latch 234. The address latch 232 may store the active address ACT_ADD as the sampling address SAM_ADD according to the latch enable signal LAT_EN, and output the stored sampling address SAM_ADD to the row-hammer analysis circuit 270 according to the target refresh command TREF. The counting latch 234 may store the summation data CNT_SUM as the maximum counting data MAX_CNT according to the latch enable signal LAT_EN. The address latch 232 and the counting latch 234 may be initialized in response to the row-hammer reset signal RH_RST.

The latch control circuit 240 may generate the summation data CNT_SUM by adding the first data CNT_R1 and the second data CNT_R2, and generate the latch enable signal LAT_EN by comparing the summation data CNT_SUM with the maximum counting data MAX_CNT. For reference, the first data CNT_R1 and the second data CNT_R2 may be read out from the active row corresponding to the active address ACT_ADD, through the second output driving circuit 1344 and the third output driving circuit 1364 of FIG. 4.

In detail, the latch control circuit 240 may include a counting summation circuit 242 and a comparison circuit 244. The counting summation circuit 242 may generate the summation data CNT_SUM by adding a value of the first data CNT_R1 and a value of the second data CNT_R2. The summation data CNT_SUM may have a value corresponding to a total number of accesses of a corresponding row calculated by adding the number of direct accesses to the corresponding row and the number of accesses to a paired row of the corresponding row, i.e., by adding the numbers of direct and indirect accesses to the corresponding row. The comparison circuit 244 may generate the latch enable signal LAT_EN by comparing the summation data CNT_SUM with the maximum counting data MAX_CNT. The comparison circuit 244 may enable the latch enable signal LAT_EN when the summation data CNT_SUM is greater than or equal to the maximum counting data MAX_CNT.

The first update circuit 250 may update the first data CNT_R1 to output the updated first data CNT_W1 when the first internal read signal IRD1 is inputted. The first update circuit 250 may increase a value of the first data CNT_R1 by "+1" to output the updated first data CNT_W1 when the first internal read signal IRD1 is inputted. The first update circuit 250 may initialize the first data CNT_W1 to a specific value (e.g., "0") when the row-hammer reset signal RH_RST is enabled.

The second update circuit 260 may update the second data CNT_R2 to output the updated second data CNT_W2 when the second internal read signal IRD2 is inputted. The second update circuit 260 may increase a value of the second data CNT_R2 by "+1" to output the updated second data CNT_W2 when the second internal read signal IRD2 is inputted. The second update circuit 260 may initialize the second data CNT_W2 to a specific value (e.g., "0") when the row-hammer reset signal RH_RST is enabled. The updated first data CNT_W1 and the updated second data CNT_W2 may be provided to the second input driving circuit 1342 and the third input driving circuit 1362 of FIG. 4.

The row-hammer analysis circuit 270 may calculate one or more first adjacent addresses (ADJ_ADD1 of FIG. 6) based on the sampling address SAM_ADD. For reference, the one or more first adjacent addresses ADJ_ADD1 may include addresses for designating adjacent rows of the target row corresponding to the sampling address SAM_ADD. For example, the one or more first adjacent addresses ADJ_ADD1 may include addresses for designating (n±1)-th adjacent rows of the n-th target row. The row-hammer analysis circuit 270 may calculate one or more second adjacent addresses (ADJ_ADD2 of FIG. 6) based on a paired address generated by inverting a most significant bit (MSB) of the sampling address SAM_ADD, according to the pairing flag 2WL_FL and the latch enable signal LAT_EN. For reference, the one or more second adjacent addresses ADJ_ADD2 may include addresses for designating adjacent rows of the paired row of the target row corresponding to the sampling address SAM_ADD. For example, the one or more second adjacent addresses ADJ_ADD2 may include addresses for designating (m±1)-th adjacent rows of the m-th paired row. The row-hammer analysis circuit 270 may output the row-hammer address RH_ADD by scheduling the first and second adjacent addresses ADJ_ADD1 and ADJ_ADD2 according to the target refresh command TREF. The row-hammer analysis circuit 270 may enable the row-hammer reset signal RH_RST after outputting the row-hammer address RH_ADD.

Referring to FIG. 6, the row-hammer analysis circuit 270 may include a pairing control circuit 272, an adjacent address calculating circuit 274, and a row-hammer (RH) address output circuit 274.

The pairing control circuit 272 may generate a pairing control signal 2WL_FL_LAT by latching the pairing flag 2WL_FL when the latch enable signal LAT_EN is enabled. The pairing control signal 2WL_FL_LAT may be defined as a signal indicating whether the cell mat in which the target row corresponding to the sampling address SAM_ADD is disposed has been repaired to another cell mat.

The adjacent address calculating circuit 274 may calculate the one or more first adjacent addresses ADJ_ADD1 based on the sampling address SAM_ADD, and calculate the one or more second adjacent addresses ADJ_ADD2 based on the paired address generated by inverting the MSB of the sampling address SAM_ADD, when the pairing control signal 2WL_FL_LAT is enabled. In detail, the adjacent address calculating circuit 274 may include first and second calculating circuits 2742 and 2744. The first calculating circuit 2742 may calculate the one or more first adjacent addresses ADJ_ADD1 by increasing and/or decreasing the sampling address SAM_ADD by "+1". The second calculating circuit 2744 may calculate the one or more second adjacent addresses ADJ_ADD2 by increasing and/or decreasing the paired address by "+1", when the pairing control signal 2WL_FL_LAT is enabled. Depending on an embodiment, the adjacent address calculating circuit 274 may be activated according to the target refresh command TREF.

The row-hammer address output circuit 276 may output the row-hammer address RH_ADD by scheduling the first and second adjacent addresses ADJ_ADD1 and ADJ_ADD2 according to the target refresh command TREF. For example, the row-hammer address output circuit 276 may output an address for designating an n−1 adjacent row and an address for designating an m−1 adjacent row substantially simultaneously as the row-hammer address RH_ADD, and output an address for designating an n+1 adjacent row and an address for designating an m+1 adjacent row substantially simultaneously as the row-hammer address RH_ADD. The row-hammer address output circuit 276 may enable the row-hammer reset signal RH_RST after outputting the row-hammer address RH_ADD. The row-hammer address output circuit 276 may output the sampling address SAM_ADD as the row-hammer address RH_ADD when the row-hammer reset signal RH_RST is enabled. Thereafter, the row-hammer address output circuit 276 may output the paired address of the sampling address SAM_ADD as the row-hammer address RH_ADD according to the pairing control signal 2WL_FL_LAT.

Hereinafter, referring to FIGS. 2 to 12C, an operation of the semiconductor memory device 100 will be described. Hereinafter, a case where the first cell mat MAT1 is repaired using the redundancy column of the third cell mat MAT3, and the nth row WLn of the first cell mat MAT1 and the mth row WLm of the third cell mat MAT3 are designated as the paired rows, and the repair control circuit 150 stores the cell mat information about the first cell mat MAT1, will be described as an example.

Figure 7:
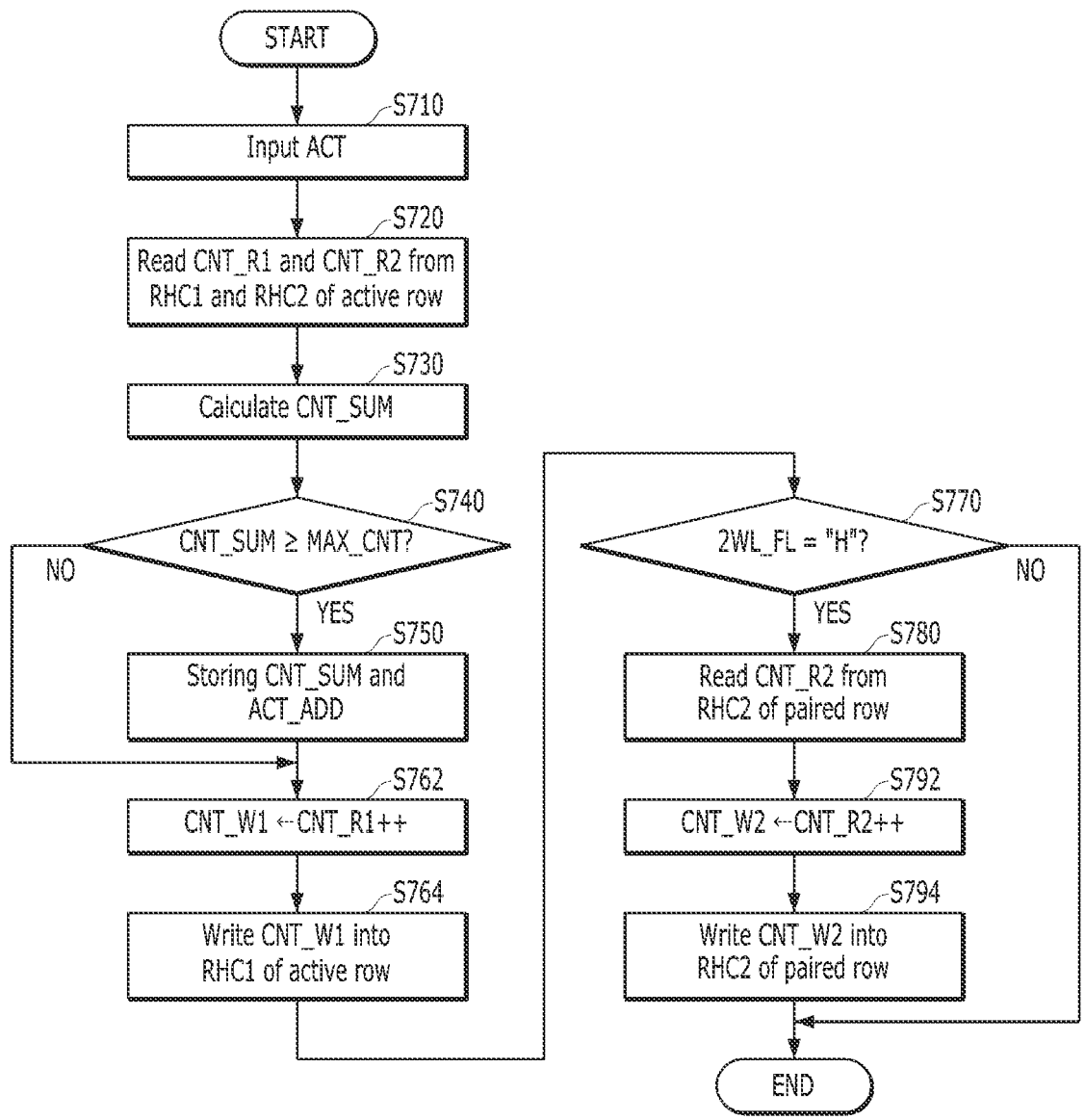
FIG. 7 is a flow chart for describing an active operation of a semiconductor memory device in accordance with an embodiment of the present invention.

FIG. 7 is a flow chart for describing an active operation of a semiconductor memory device in accordance with an embodiment of the present invention. FIGS. 8A to 8D are diagrams for describing each operation of FIG. 7 in accordance with an embodiment of the present invention.

Referring to FIG. 7, an operation of the semiconductor memory device 100 when the active command ACT is inputted is shown.

When the active command ACT is inputted (at S710), the row control circuit 120 may activate the active row corresponding to the active address ACT_ADD. When the active address ACT_ADD for designating the nth row Wn of the first cell mat MAT1 is inputted, the repair control circuit 150 may enable the pairing flag 2WL_FL, and the row control circuit 120 may simultaneously activate the paired row of the active row according to the pairing flag 2WL_FL. That is, the row control circuit 120 may activate the mth row WLm of the third cell mat MAT3 in addition to activate the nth row Wn of the first cell mat MAT1. Here, the nth row Wn is designated by the active address ACT_ADD, and the mth row WLm is designated by the paired address generated by inverting the MSB of the active address ACT_ADD. Accordingly, as both the first I/O switching signals IOSW_M of the first cell mat MAT1 and the third cell mat MAT3 are enabled, the first switching circuits 112 of the first cell mat MAT1 and the third cell mat MAT3 operate. According to the repair information RED denoting that a defective column of the first cell mat MAT1 is replaced by a redundancy column of the third cell mat MAT3, a repair operation may be performed such that the first switching circuit 112 of the first cell mat MAT1 masks the segment I/O line SIO corresponding to the defective column, and the first switching circuit 112 of the third cell mat MAT3 selects only the segment I/O line SIO corresponding to the redundancy column.

Figure 8A:
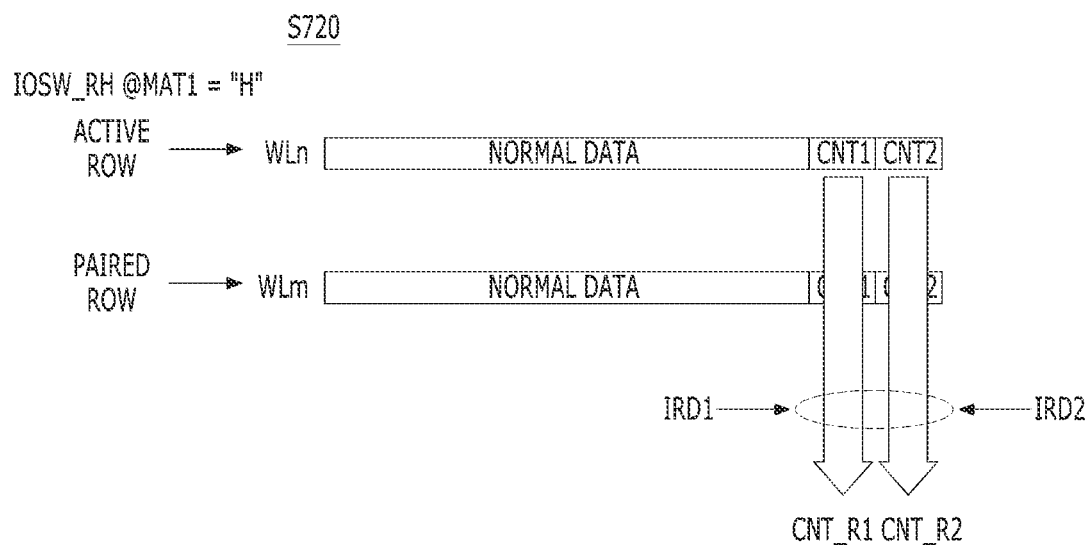
FIGS. 8A to 8D are diagrams for describing each operation of FIG. 7 in accordance with an embodiment of the present invention.

Further, the row control circuit 120 may enable the second I/O switching signal IOSW_RH of the first cell mat MAT1 (IOSW_RH @MAT1="H"). The second command issue circuit 214 may issue the first and second internal read signals IRD1 and IRD2. As shown in FIG. 8A, the second column control circuit 134 and the third column control circuit 136 of the first cell mat MAT1 may respectively read out the first data CNT_R1 and the second data CNT_R2 from the first row-hammer cells RHC1 and the second row-hammer cells RHC2 of the active row WLn, according to the first and second internal read signals IRD1 and IRD2 (at S720).

The latch control circuit 240 may calculate the summation data CNT_SUM by adding the first data CNT_R1 and the second data CNT_R2 (at S730).

When a value of the summation data CNT_SUM is greater than or equal to a value of the maximum counting data MAX_CNT ("YES" of S740), the latch control circuit 240 may enable the latch enable signal LAT_EN, and thus the latch circuit 230 may store the active address ACT_ADD and the summation data CNT_SUM as the sampling address SAM_ADD and the maximum counting data MAX_CNT, respectively (at S750). As the latch enable signal LAT_EN is enabled, the row-hammer analysis circuit 270 may enable the pairing control signal 2WL_FL_LAT by latching the pairing flag 2WL_FL.

When the value of the summation data CNT_SUM is less than the value of the maximum counting data MAX_CNT ("NO" of S740), the latch control circuit 240 may disable the latch enable signal LAT_EN, and the latch circuit 230 may maintain the previous values of the sampling address SAM_ADD and the maximum counting data MAX_CNT.

Figure 8B:
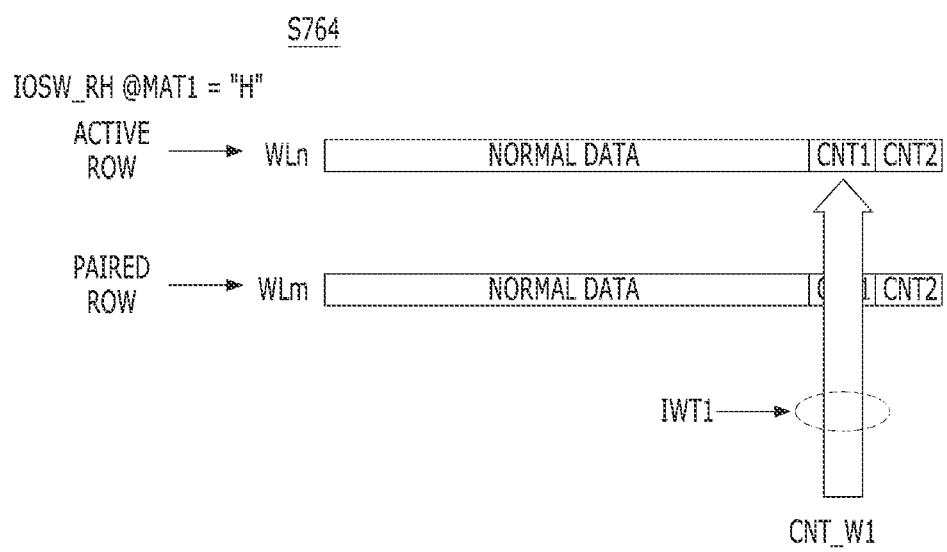

The first update circuit 250 may update the first data CNT_R1 to output the updated first data CNT_W1 when the first internal read signal IRD1 is inputted (at S762). After a predetermined time, the second command issue circuit 214 may issue the first internal write signal IWT1. As shown in FIG. 8B, the second column control circuit 134 of the first cell mat MAT1 may write the updated first data CNT_W1 provided from the refresh control circuit 160, into the first row-hammer cells RHC1 of the active row Wn according to the first internal write signal IWT1 (at S764).

Subsequently, the active operation is finished when the pairing flag 2WL_FL is disabled to a logic low level ("NO" of S770).

Figure 8C:
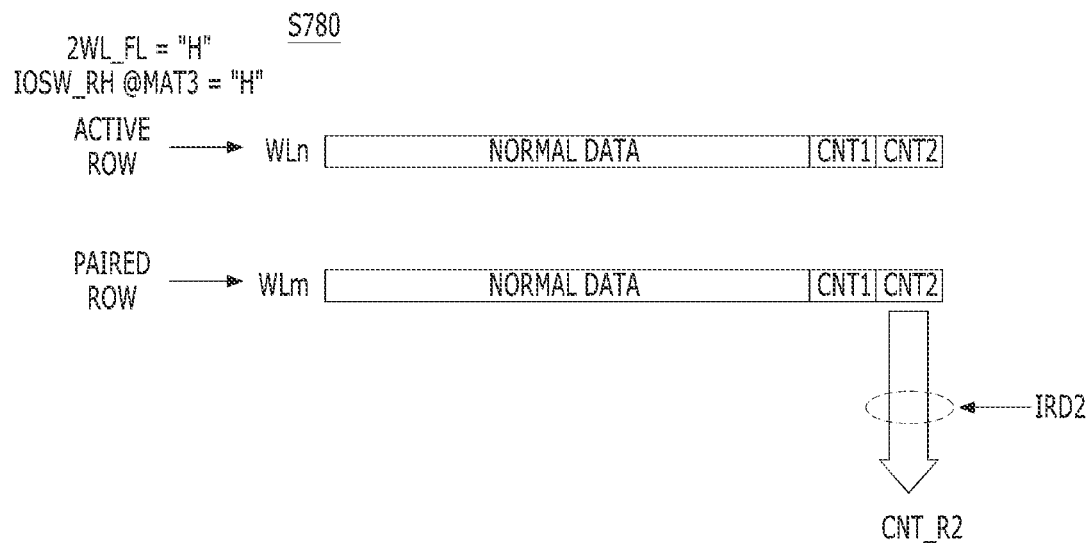

Moreover, when the pairing flag 2WL_FL is enabled to a logic high level ("YES" of S770), the row control circuit 120 may enable the second I/O switching signal IOSW_RH of the third cell mat MAT3 (IOSW_RH @ MAT3="H"). The second command issue circuit 214 may issue the second internal read signal IRD2. As shown in FIG. 8C, the third column control circuit 136 of the third cell mat MAT3 may read out the second data CNT_R2 from the second row-hammer cells RHC2 of the paired row WLm, according to the first internal read signal IRD2 (at S780).

Figure 8D:
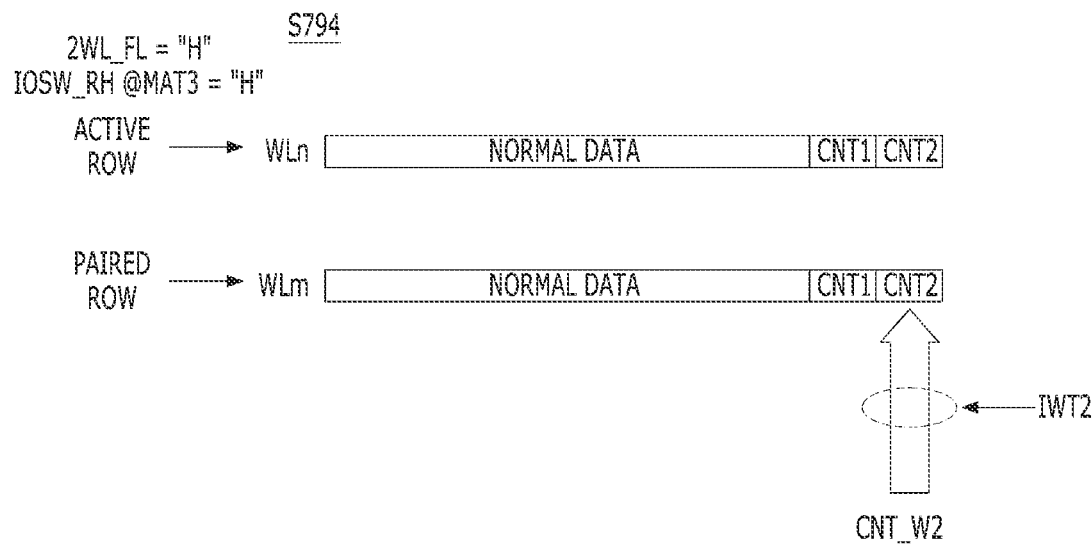

The second update circuit 260 may update the second data CNT_R2 to output the updated second data CNT_W2 when the second internal read signal IRD2 is inputted (at S792). After a predetermined time, the second command issue circuit 214 may issue the second internal write signal IWT2. As shown in FIG. 8D, the second column control circuit 134 of the third cell mat MAT3 may write the updated second data CNT_W2 provided from the refresh control circuit 160, into the second row-hammer cells RHC2 of the paired row Wm according to the second internal write signal IWT2 (at S794).

A method of managing the first data CNT1 and the second data CNT1 during the active operation described in FIGS. 7 to 8D will be summarized below.

Figure 9A:
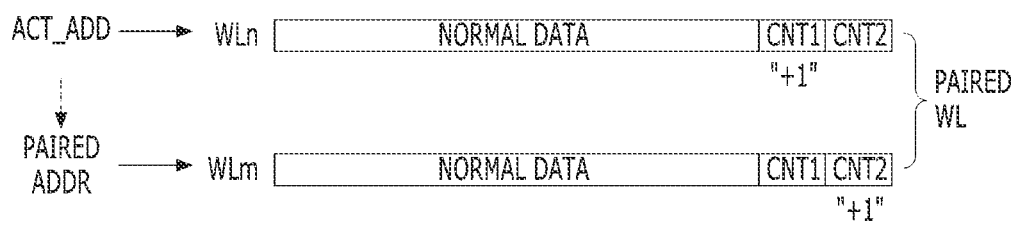
FIGS. 9A and 9B are diagrams illustrating a method of managing first and second data of an active row and a paired row in accordance with an embodiment of the present invention.
Figure 9B:
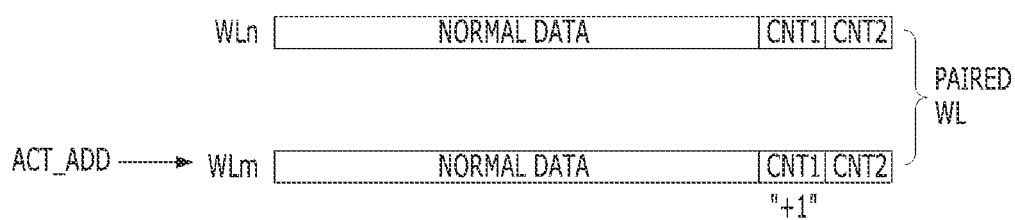

FIGS. 9A and 9B are diagrams illustrating a method of managing the first data CNT1 and the second data CNT1 of the active row WLn and the paired row WLm in accordance with an embodiment of the present invention.

Referring to FIG. 9A, when the active address ACT_ADD for designating the nth row Wn of the first cell mat MAT1 is inputted, the repair control circuit 150 may enable the pairing flag 2WL_FL. Here, the nth row Wn of the first cell mat MAT1 becomes an active row, and the mth row Wm of the third cell mat MAT3, which is designated by a paired address generated by inverting the MSB of the active address ACT_ADD, becomes a paired row of the active row. Accordingly, the refresh control circuit 160 may update the first data CNT_R1 read out from the active row Wn by increasing a value of the first data CNT_R1 by "+1", and control the updated first data CNT_W1 to be written into the active row WLn. Further, the refresh control circuit 160 may update the second data CNT_R2 read out from the paired row WLm by increasing a value of the second data CNT_R2 by "+1", and control the updated second data CNT_W2 to be written into the paired row WLm. As a result, when the pairing flag 2WL_FL is enabled, the first data CNT1 of the active row Wn and the second data CNT2 the paired row WLm may be managed with the same value.

Referring to FIG. 9B, when the active address ACT_ADD for designating the mth row Wm of the third cell mat MAT3 is inputted, the repair control circuit 150 may disable the pairing flag 2WL_FL. Here, the mth row Wm of the third cell mat MAT3 becomes an active row, and the nth row Wn of the first cell mat MAT1, which is designated by a paired address generated by inverting the MSB of the active address ACT_ADD, becomes a paired row of the active row. Accordingly, the refresh control circuit 160 may update the first data CNT_R1 read out from the active row Wm by increasing a value of the first data CNT_R1 by "+1", and control the updated first data CNT_W1 to be written into the active row WLm. However, the refresh control circuit 160 may not update the second data CNT_R2 read out from the paired row WLn. As a result, when the pairing flag 2WL_FL is disabled, the first data CNT1 of the active row Wm and the second data CNT2 the paired row WLn may be managed with different values from each other.

As described above, in the embodiment of the present invention, the semiconductor memory device 100 respectively manages the first row-hammer cells RHC1 for storing the first data CNT1 that represents the number of direct accesses to the active row, and the second row-hammer cells RHC2 for storing the second data CNT2 that represents the number of Indirect accesses to the active row (i.e., the number of accesses to the paired row of the active row), and the first data (CNT1) and second data (CNT2). The semiconductor memory device 100 selects the row-hammer address according to the actual number of accesses calculated by adding the number of direct accesses and the number of indirect accesses, to thereby optimize the defense capability for row-hammer and improve the accuracy and efficiency of the refresh operation.

Figure 10:
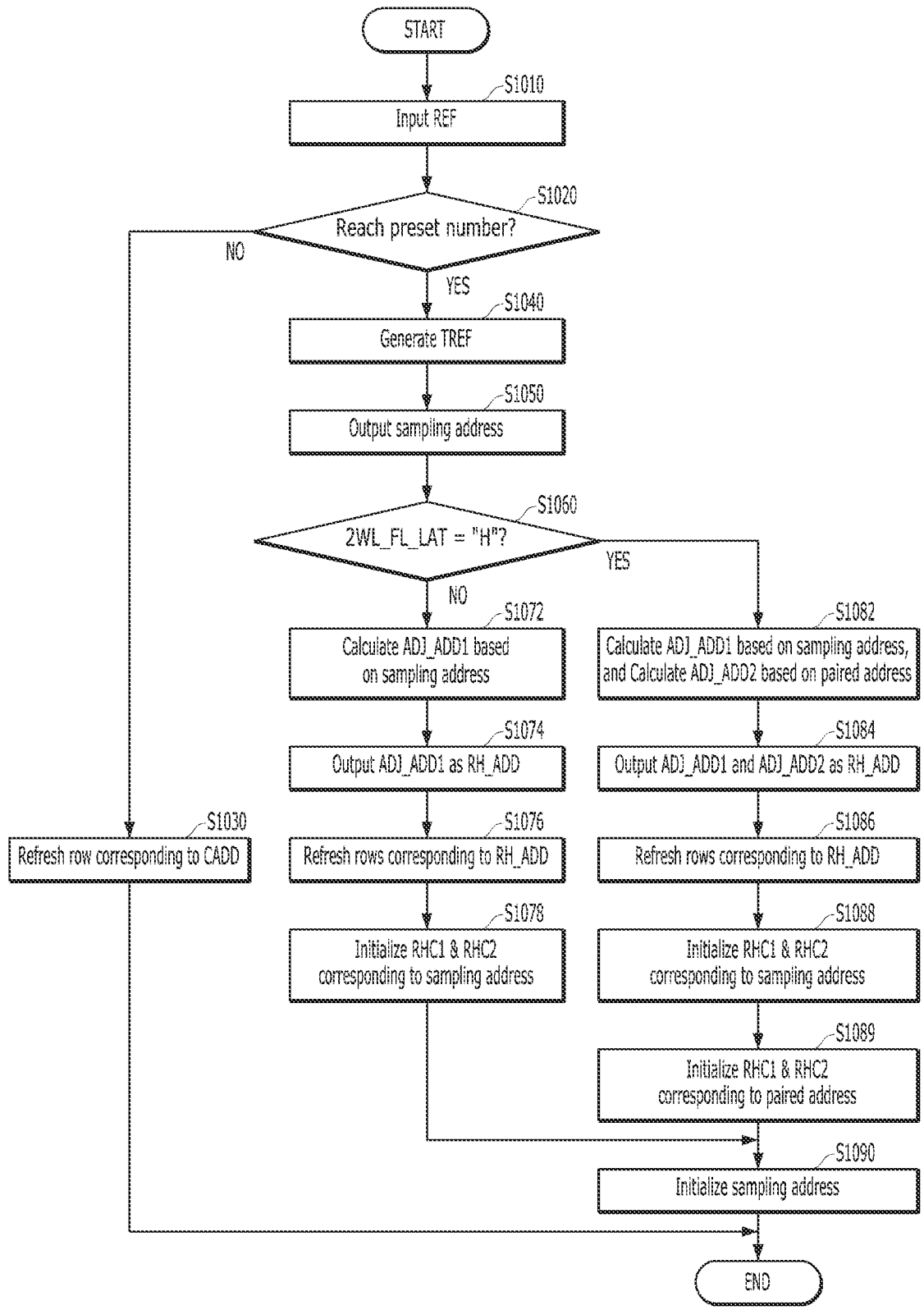
FIG. 10 is a flow chart for describing a refresh operation of a semiconductor memory device in accordance with an embodiment of the present invention.

FIG. 10 is a flow chart for describing a refresh operation of a semiconductor memory device in accordance with an embodiment of the present invention. FIGS. 11A to 12C are diagrams for describing each operation of FIG. 10 in accordance with an embodiment of the present invention.

Referring to FIG. 10, when the normal refresh command REF is inputted (at S1010), the refresh counter 220 may generate the counting address CADD that is sequentially increased by "+1". Until the number of inputs of the normal refresh command REF reaches the preset number ("NO" of S1020), the row control circuit 120 may perform a normal refresh operation of sequentially refreshing the plurality of rows corresponding to the counting address CADD according to the normal refresh command REF (at S1030).

When the number of inputs of the normal refresh command REF reaches the preset number ("YES" of S1020), the first command issue circuit 212 may issue the target refresh command TREF (at S1040).

The latch circuit 230 may output the sampling address SAM_ADD to the row-hammer analysis circuit 270, in response to the target refresh command TREF (at S1050). During the active operation of FIG. 7, the row-hammer analysis circuit 270 may generate the pairing control signal 2WL_FL_LAT by latching the pairing flag 2WL_FL when the latch enable signal LAT_EN is enabled. That is, the row-hammer analysis circuit 270 may store a state of the pairing flag 2WL_FL as the pairing control signal 2WL_FL_LAT when the sampling address SAM_ADD is selected, to thereby determine whether the paired row of the target row corresponding to the sampling address SAM_ADD exists or not. Hereinafter, a case where the nth row WLn of the first cell mat MAT1 is stored as the sampling address SAM_ADD will be described as an example.

Figure 11A:
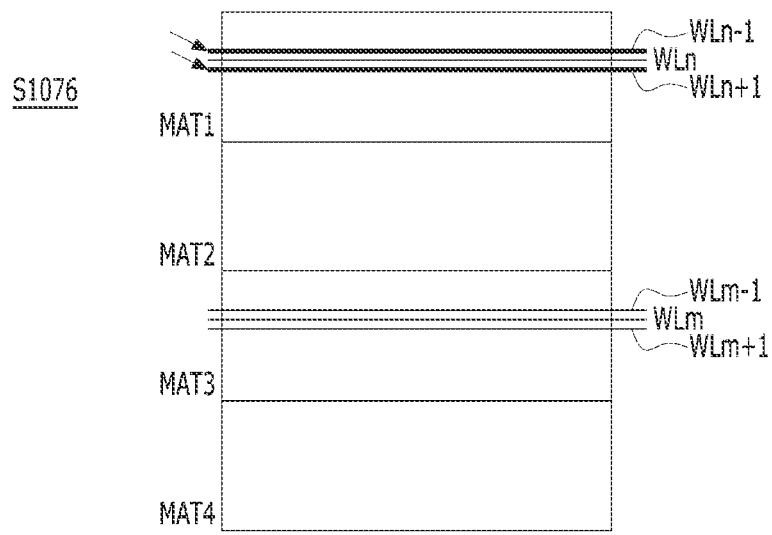
FIGS. 11A to 12C are diagrams for describing each operation of FIG. 10.

In a case where the pairing control signal 2WL_FL_LAT is disabled to a logic low level ("NO" of S1060), i.e., the paired row of the target row does not exist, the row-hammer analysis circuit 270 may calculate the one or more first adjacent addresses ADJ_ADD1 by increasing and/or decreasing the sampling address SAM_ADD by "+1" (at S1072). The one or more first adjacent addresses ADJ_ADD1 may include addresses for designating (n±1)-th adjacent rows Wn±1 of the target row Wn. The row-hammer analysis circuit 270 may output the row-hammer address RH_ADD by scheduling the one or more first adjacent addresses ADJ_ADD1 according to the target refresh command TREF (at S1074). As shown in FIG. 11A, the row control circuit 120 may perform a target refresh operation of refreshing one or more adjacent rows corresponding to the row-hammer address RH_ADD according to the target refresh command TREF (at S1076).

Figure 11B:
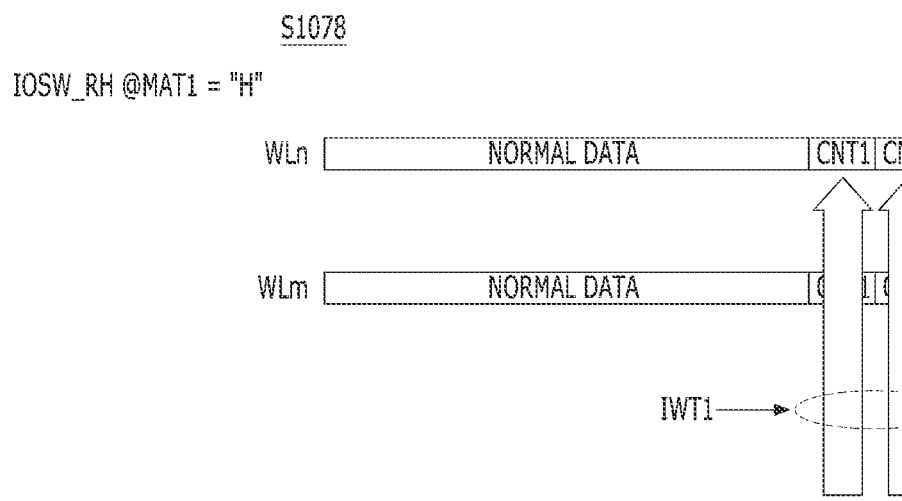

Thereafter, the row-hammer analysis circuit 270 may enable the row-hammer reset signal RH_RST, and output the sampling address SAM_ADD as the row-hammer address RH_ADD. The row control circuit 120 may enable the second I/O switching signal IOSW_RH of the first cell mat MAT1 (IOSW_RH @ MAT1="H"). In response to the row-hammer reset signal RH_RST, the second command issue circuit 214 may issue the first and second internal write signals IWT1 and IWT2, and the first update circuit 250 and the second update circuit 260 may initialize the first data CNT_W1 and the second data CNT_W2 to a specific value (e.g., "0"). As shown in FIG. 11B, the second column control circuit 134 and the third column control circuit 136 may initialize the first and second row-hammer cells RHC1 and RHC2 by writing the first and second data CNT_W1 and CNT_W2 provided from the refresh control circuit 160, into the first and second row-hammer cells RHC1 and RHC2 of the target row Wn according to the first and second internal write signals IWT1 and IWT2 (at S1078).

Figure 12A:
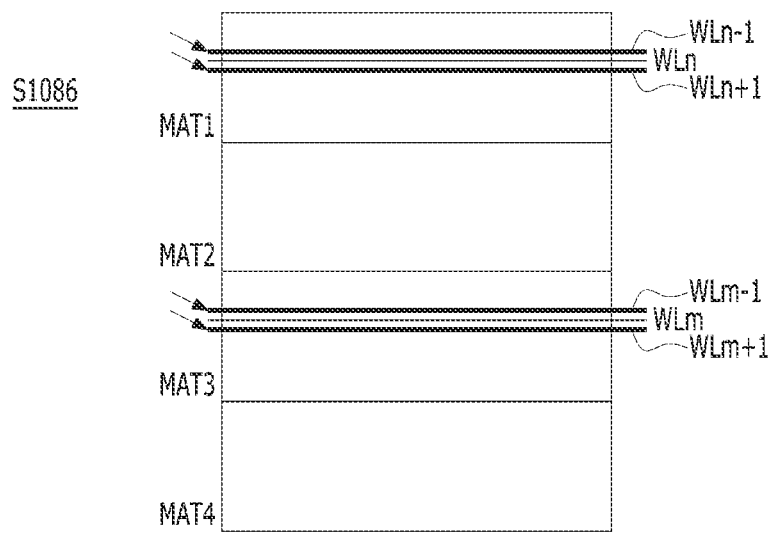

In a case where the pairing control signal 2WL_FL_LAT is enabled to a logic high level ("YES" of S1060), i.e., the paired row of the target row exists, the row-hammer analysis circuit 270 may calculate the one or more first adjacent addresses ADJ_ADD1 by increasing and/or decreasing the sampling address SAM_ADD by "+1", and calculate the one or more second adjacent addresses ADJ_ADD2 by increasing and/or decreasing the paired address by "+1" (at S1082). The paired address may be generated by inverting the MSB of the sampling address SAM_ADD. The one or more second adjacent addresses ADJ_ADD2 may include addresses for designating (m±1)-th adjacent rows Wm±1 of the paired row Wm of the target row WLn. The row-hammer analysis circuit 270 may output the row-hammer address RH_ADD by scheduling the first and second adjacent addresses ADJ_ADD1 and ADJ_ADD2 according to the target refresh command TREF (at S1084). As shown in FIG. 12A, the row control circuit 120 may perform a target refresh operation of refreshing one or more adjacent rows corresponding to the row-hammer address RH_ADD according to the target refresh command TREF (at S1086).

Figure 12B:
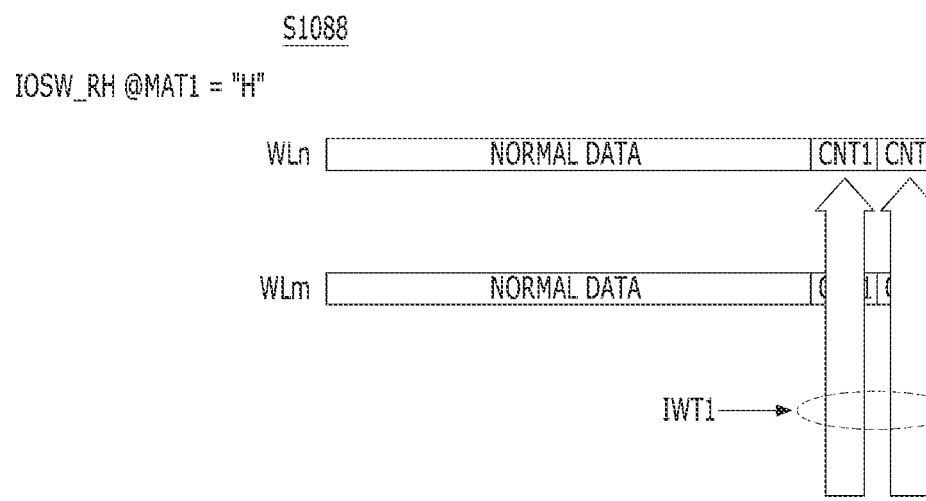
Figure 12C:
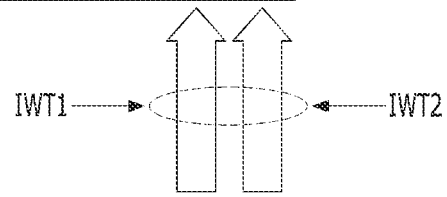

Thereafter, the row-hammer analysis circuit 270 may enable the row-hammer reset signal RH_RST, and sequentially output the sampling address SAM_ADD and the paired address as the row-hammer address RH_ADD. The row control circuit 120 may enable the second I/O switching signal IOSW_RH of the first cell mat MAT1 (IOSW_RH @ MAT1="H") in which the target row Wn corresponding to the sampling address SAM_ADD is disposed, and enable the second I/O switching signal IOSW_RH of the third cell mat MAT3 (IOSW_RH @ MAT3="H") in which the paired row Wm corresponding to the paired address is disposed. In response to the row-hammer reset signal RH_RST, the second command issue circuit 214 may issue the first and second internal write signals IWT1 and IWT2, and the first update circuit 250 and the second update circuit 260 may initialize the first data CNT_W1 and the second data CNT_W2 to a specific value (e.g., "0"). The second column control circuit 134 and the third column control circuit 136 may initialize the first and second row-hammer cells RHC1 and RHC2 of the target row Wn (at S1088) as shown in FIG. 12B, and initialize the first and second row-hammer cells RHC1 and RHC2 of the paired row Wm (at S1089) as shown in FIG. 12C.

The latch circuit 230 may initialize the stored sampling address SAM_ADD and the maximum counting data MAX_CNT data according to the row-hammer reset signal RH_RST (at S1090).

As described above, the memory device 100 in accordance with an embodiment may additionally dispose the first and second row-hammer cell region 110_3 and 110_4 in the memory cell region 110, and store, into the first row-hammer cells RHC1 of the first row-hammer cell region 110_3, the first data CNT1 obtained by counting the number of direct accesses to a corresponding row, and store, into the second row-hammer cells RHC2 of the second row-hammer cell region 110_4, the second data CNT2 obtained by counting the number of accesses to a paired row of the corresponding row. When the active command ACT is inputted, the memory device 100 may calculate the total number of accesses by adding the first data CNT1 and the second data CNT2 of the active row corresponding to the active address ACT_ADD, and select the sampling address SAM_ADD based on the total number of accesses. When the refresh command REF is inputted, the memory device 100 may perform the target refresh operation on the adjacent rows to the target row corresponding to the selected sampling address SAM_ADD, and selectively perform the target refresh operation on the adjacent rows to the paired row of the target row. Accordingly, even when the 2WL column repair scheme is applied to the memory device 100, the accuracy and efficiency of the refresh operation may be improved, the defense capability for row-hammer may be optimized, and the power consumption may be minimized.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A semiconductor memory device, comprising:
    a memory cell region including a plurality of cell mats in each of which a plurality of rows are disposed, each row coupled to normal cells and row-hammer cells;
    a repair control circuit configured to generate a pairing flag denoting whether a cell mat in which an active row corresponding to an active address is disposed, is repaired with another cell mat; and
    a refresh control circuit configured to:
    select, when an active command is inputted, a sampling address based on first and second data read from the row-hammer cells of the active row,
    refresh, when a target refresh command is inputted, one or more adjacent rows to a target row corresponding to the sampling address while selectively refreshing one or more adjacent rows to a paired row of the target row according to the pairing flag,
    wherein the paired row of the target row is both disposed in another cell mat which stores repair data for a cell mat including the target row and activated together with the target row.

2. The semiconductor memory device of claim 1, wherein:
    the first and second data are stored in the row-hammer cells of individual rows,
    the first data stored in a corresponding row represents a number of accesses to the corresponding row, and
    the second data stored in the corresponding row represents a number of accesses to a paired row of the corresponding row.

3. The semiconductor memory device of claim 1,
    wherein at least one column of a first cell mat in which a corresponding row is disposed is repaired with a column of a second cell mat, and
    wherein a paired row of the corresponding row is disposed in the second cell mat and is designated by a paired address generated by inverting a most significant bit (MSB) of the address for designating the corresponding row.

4. The semiconductor memory device of claim 3, wherein adjacent cell mats among the plurality of cell mats share a bit line sense amplifier and the first and second cell mats do not share the bit line sense amplifier.

5. The semiconductor memory device of claim 1, wherein the refresh control circuit selects the sampling address by:
    generating summation data by adding the first data and the second data, and
    selecting the active address as the sampling address when a value of the summation data is greater than or equal to a pre-stored maximum value.

6. The semiconductor memory device of claim 1, wherein the refresh control circuit is further configured to:
    update, when the active command is inputted for the active row, the first data read from the row-hammer cells of the active row by increasing a value of the first data read from the row-hammer cells of the active row,
    control the updated first data to be written into the row-hammer cells of the active row,
    update, when the active command is inputted for the active row, according to the pairing flag, the second data read from the row-hammer cells of the paired row of the active row by increasing a value of the second data read from the row-hammer cells of the paired row of the active row, and
    control the updated second data to be written into the row-hammer cells of the paired row of the active row.

7. The semiconductor memory device of claim 1,
    wherein the refresh control circuit is further configured to initialize, after the selectively refreshing, the row-hammer cells of the target row and the paired row of the target row.

8. The semiconductor memory device of claim 1, wherein the refresh control circuit includes:
    a latch control circuit configured to generate summation data by adding the first data and the second data and generate a latch enable signal by comparing the summation data with maximum counting data;
    a latch circuit initialized by a row-hammer reset signal and configured to sort the active address and the summation data respectively as the sampling address and the maximum counting data according to the latch enable signal; and
    a row-hammer analysis circuit configured to:
    calculate one or more first adjacent addresses from the sampling address,
    calculate one or more second adjacent addresses from the sampling address according to the latch enable signal and the pairing flag, and
    output a row-hammer address by scheduling the first and second adjacent addresses according to the target refresh command while enabling the row-hammer reset signal.

9. The semiconductor memory device of claim 8, wherein the refresh control circuit further includes:
    a first command issue circuit configured to generate the target refresh command when a normal refresh command is inputted a predetermined number of times; and
    a second command issue circuit configured to generate, according to the active command, the pairing flag, and the row-hammer reset signal, first and second internal read signals and first and second internal write signals.

10. The semiconductor memory device of claim 9, wherein the refresh control circuit further includes:
    a first update circuit initialized by the row-hammer reset signal and configured to update the first data by increasing a value of the first data when the first internal read signal is inputted; and
    a second update circuit initialized by the row-hammer reset signal and configured to update the second data by increasing a value of the second data when the second internal read signal is inputted.

11. The semiconductor memory device of claim 9, further comprising:

a row control circuit configured to refresh one or more rows corresponding to the row-hammer address according to the target refresh command;

a first column control circuit configured to read the first data from the row-hammer cells according to the first internal read signal, and write the first data into the row-hammer cells according to the first internal write signal; and a second column control circuit configured to read the second data from the row-hammer cells according to the second internal read signal, and write the second data into the row-hammer cells according to the second internal write signal.

12. The semiconductor memory device of claim 8, wherein the row-hammer analysis circuit includes:

a pairing control circuit configured to generate a pairing control signal by latching the pairing flag according to the latch enable signal;

an adjacent address calculating circuit configured to calculate the first adjacent addresses based on the sampling address, and calculate the second adjacent addresses based on a paired address generated by inverting a most significant bit (MSB) of the sampling address according to the pairing control signal; and a row-hammer address output circuit configured to output the row-hammer address by scheduling the first and second adjacent addresses according to the target refresh command while enabling the row-hammer reset signal.

13. A semiconductor memory device, comprising:

a memory cell region including a plurality of cell mats in each of which a plurality of rows are disposed, each row coupled to normal cells, first row-hammer cells and second row-hammer cells;

a refresh control circuit configured to select, when an active command is inputted, a sampling address based on first and second data respectively read from the first and second row-hammer cells of an active row corresponding to an active address, and output, when a target refresh command is inputted, a row-hammer address by calculating one or more first and second adjacent addresses from the sampling address according to a pairing control signal denoting whether a cell mat in which a target row corresponding to the sampling address is disposed is repaired with another cell mat both storing repair data for the cell mat and having a paired row activated together with the target row; and a row control circuit configured to refresh one or more adjacent rows to the target row while selectively refreshing one or more adjacent rows to the paired row of the target row, according to the row-hammer address, when the target refresh command is inputted.

14. The semiconductor memory device of claim 13, wherein the first and second data are stored in the row-hammer cells of the individual rows, wherein the first data stored in a corresponding row represents a number of accesses to the corresponding row, and wherein the second data stored in the corresponding row represents a number of accesses to a paired row of the corresponding row by a paired address generated by inverting a most significant bit (MSB) of the address for designating the corresponding row.

15. The semiconductor memory device of claim 13, wherein the refresh control circuit selects the sampling address by generating summation data by adding the first data and the second data, and selecting the active address as the sampling address when a value of the summation data is greater than or equal to a pre-stored maximum value.

16. The semiconductor memory device of claim 13, wherein the refresh control circuit is further configured to update, when the active command is inputted for the active row, the first data read from the row-hammer cells of the active row by increasing a value of the first data read from the row-hammer cells of the active row, control the updated first data to be written into the first row-hammer cells of the active row, update, when the active command is inputted for the active row, according to a pairing flag denoting whether a cell mat in which the active row is disposed is repaired with another cell mat, the second data read from the row-hammer cells of a paired row of the active row by increasing a value of the second data read from the row-hammer cells of the paired row of the active row, and control the updated second data to be written into the second row-hammer cells of the paired row.

17. The semiconductor memory device of claim 13, wherein the refresh control circuit is further configured to initialize, after the outputting of the row-hammer address, the first and second row-hammer cells of the target row and the paired row of the target row.

18. An operating method of a semiconductor memory device including a plurality of cell mats in each of which a plurality of rows are disposed, each row coupled to normal cells and row-hammer cells, the operating method comprising:

selecting, when an active command is inputted, a sampling address based on first and second data read from the row-hammer cells of an active row corresponding to an active address;

outputting, when a target refresh command is inputted, a row-hammer address by calculating one or more first and second adjacent addresses from the sampling address according to a pairing control signal denoting whether a cell mat in which a target row corresponding to the sampling address is disposed is repaired with another cell mat both storing repair data for the cell mat and having a paired row activated together with the target row; and refreshing one or more adjacent rows to the target row while selectively refreshing one or more adjacent rows to the paired row of the target row, according to the row-hammer address, when the target refresh command is inputted.

19. The operating method of claim 18, wherein the first and second data are stored in the row-hammer cells of individual rows, wherein the first data stored in a corresponding row represents a number of accesses to the corresponding row, and wherein the second data stored in the corresponding row represents a number of accesses to a paired row of the corresponding row.

20. The operating method of claim 18,
wherein at least one column of a first cell mat in which a corresponding row is disposed is repaired to a column of a second cell mat, and
wherein a paired row of the corresponding row is disposed in the second cell mat and is designated by a paired address generated by inverting a most significant bit (MSB) of the address for designating the selected row.

21. The operating method of claim 20, wherein adjacent cell mats among the plurality of cell mats share a bit line sense amplifier and the first and second cell mats do not share the bit line sense amplifier.

22. The operating method of claim 18, wherein the selecting the sampling address includes:
generating summation data by adding the first data and the second data; and
selecting the active address as the sampling address when a value of the summation data is greater than or equal to a pre-stored maximum value.

23. The operating method of claim 18, further comprising:
updating, when the active command is inputted for the active row, the first data read from the row-hammer cells of the active row by increasing a value of the first data read from the row-hammer cells of the active row;
controlling the updated first data to be written into the row-hammer cells of the active row;
updating, when the active command is inputted for the active row, according to a pairing flag denoting whether a cell mat in which the active row is disposed is repaired with another cell mat, the second data read from the row-hammer cells of a paired row of the active row by increasing a value of the second data read from the row-hammer cells of the paired row of the active row; and
controlling the updated second data to be written into the row-hammer cells of the paired row of the active row.

24. The operating method of claim 18, wherein the outputting the row-hammer address includes:
calculating one or more first adjacent addresses based on the sampling address;
calculating one or more second adjacent addresses based on a paired address generated by inverting a most significant bit (MSB) of the sampling address according to the pairing control signal; and
outputting the row-hammer address by scheduling the first and second adjacent addresses according to the target refresh command.

25. The operating method of claim 18, further comprising initializing, after outputting the row-hammer address, the row-hammer cells of the target row and the paired row of the target row.

26. An operating method of a semiconductor memory device, the method comprising:
determining an active row of memory cells as a target row when a sum of first and second data is greater than a threshold; and
performing target refresh operations on first and second row-hammer rows respectively adjacent to the target row and a paired row of the target row,
wherein the first and second data represent numbers of accesses to the respective target and paired rows and are stored in the target row, and
wherein the target and paired rows are activated together and included in respective first and second cell mats, a column of memory cells within the first cell mat being repaired through a column within the second cell mat.

27. The operating method of claim 26, wherein the target and paired rows are of the same address except a value of a most significant bit.

* * * * *